United States Patent
Ogihara et al.

(10) Patent No.: US 6,563,138 B2
(45) Date of Patent: *May 13, 2003

(54) LOW-COST, HIGH-DENSITY LIGHT-EMITTING-DIODE ARRAY AND FABRICATION METHOD THEREOF

(75) Inventors: Mitsuhiko Ogihara, Tokyo (JP); Kazuo Tokura, Tokyo (JP); Yukio Nakamura, Tokyo (JP); Masumi Taninaka, Tokyo (JP); Takatoku Shimizu, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 39 days.

This patent is subject to a terminal disclaimer.

(21) Appl. No.: 09/750,299

(22) Filed: Dec. 29, 2000

(65) Prior Publication Data

US 2001/0007359 A1 Jul. 12, 2001

Related U.S. Application Data

(60) Continuation of application No. 09/359,789, filed on Jul. 26, 1996, now Pat. No. 6,190,935, which is a division of application No. 08/900,064, filed on Jul. 23, 1999, now Pat. No. 5,955,747.

(30) Foreign Application Priority Data

Jul. 25, 1996 (JP) .............................. 8-196522
Nov. 12, 1996 (JP) .............................. 8-299992

(51) Int. Cl.[7] .............................. H01L 33/00; B41J 3/21
(52) U.S. Cl. .............................. 257/88; 347/238
(58) Field of Search .............................. 257/88; 347/238, 347/245

(56) References Cited

U.S. PATENT DOCUMENTS 4,335,501 A 6/1982 Wickenden et al. .......... 438/34
5,093,697 A * 3/1992 Satoh .......................... 257/94

(List continued on next page.)

FOREIGN PATENT DOCUMENTS

| EP | 0 723285 A2 | 7/1996 | |
| JP | 62-152873 | 7/1987 | ............. B41J/3/21 |
| JP | 63-177478 | 7/1988 | ............. H01L/33/00 |
| JP | 63-170142 U | 11/1988 | ............. B41J/3/21 |

OTHER PUBLICATIONS

Japan Abstract Publication No. 63177478, published Jul. 21, 1988, Otake Shigeyuki; Applicant Fuji Xerox Co. Ltd.; Light–Emitting Diode Array for Optical Printer.
"Hikari Purinta no Sekkei" (Design of Optical Printers), Yoshihiro Takeikida, Triceps, 1985, pp. 121–126.

Primary Examiner—Wael Fahmy
Assistant Examiner—Anh Duy Mai
(74) Attorney, Agent, or Firm—Rabin & Berdo, PC

(57) ABSTRACT

A light-emitting-diode array is formed on a substrate having an upper layer of a semiconducting material and a lower layer of an insulating or semi-insulating material. The upper layer is divided into blocks by isolation channels that cut completely through the upper layer. The light-emitting diodes, which are formed by selective diffusion of an impurity into the upper layer, are arranged in a single row, with at least two light-emitting diodes in each block of the upper layer. Each block has a block electrode that drives the light-emitting diodes in the block. The row of light-emitting diodes is paralleled by a number of shared lines which cross the isolation channels. Each shared line is coupled to a plurality of light-emitting diodes in different blocks.

3 Claims, 47 Drawing Sheets

U.S. PATENT DOCUMENTS

| | | | |
|---|---|---|---|
| 5,177,500 A | * | 1/1993 | Ng .............................. 347/245 |
| 5,258,629 A | * | 11/1993 | Itoh et al. ...................... 257/88 |
| 5,386,139 A | * | 1/1995 | Idei et al. ...................... 257/88 |
| 5,453,386 A | | 9/1995 | Holm et al. ................... 438/28 |
| 5,483,085 A | * | 1/1996 | Holm et al. ................... 257/88 |
| 5,523,590 A | * | 6/1996 | Ogihara et al. ............... 257/88 |
| 5,530,268 A | * | 6/1996 | Ogihara et al. ............... 257/88 |
| 5,567,972 A | * | 10/1996 | Abe ............................ 257/433 |
| 5,700,714 A | * | 12/1997 | Ogihara et al. .............. 438/559 |
| 5,955,747 A | * | 9/1999 | Ogihara et al. ............... 257/88 |
| 6,191,438 B1 | * | 2/2001 | Ikehara et al. ................. 257/88 |
| 6,211,537 B1 | * | 4/2001 | Shimizu et al. ............... 257/88 |
| 6,388,696 B1 | * | 5/2002 | Taninaka et al. ............ 347/238 |

* cited by examiner

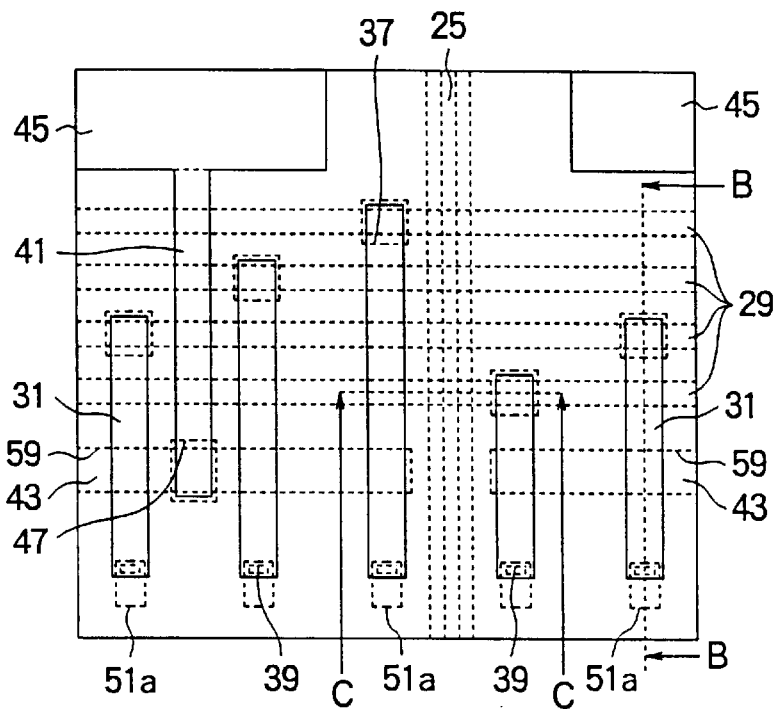
FIG. 30A
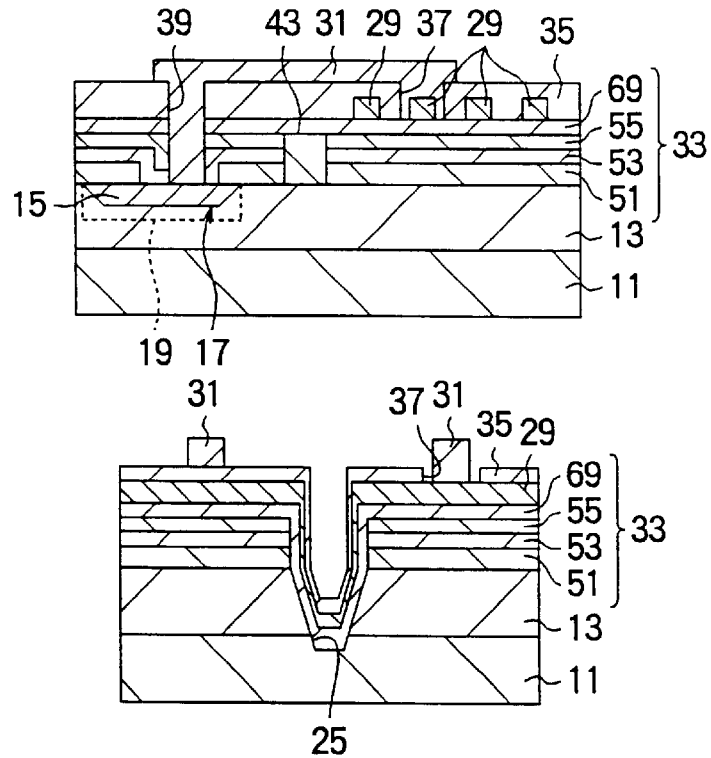
FIG. 30B
FIG. 30C

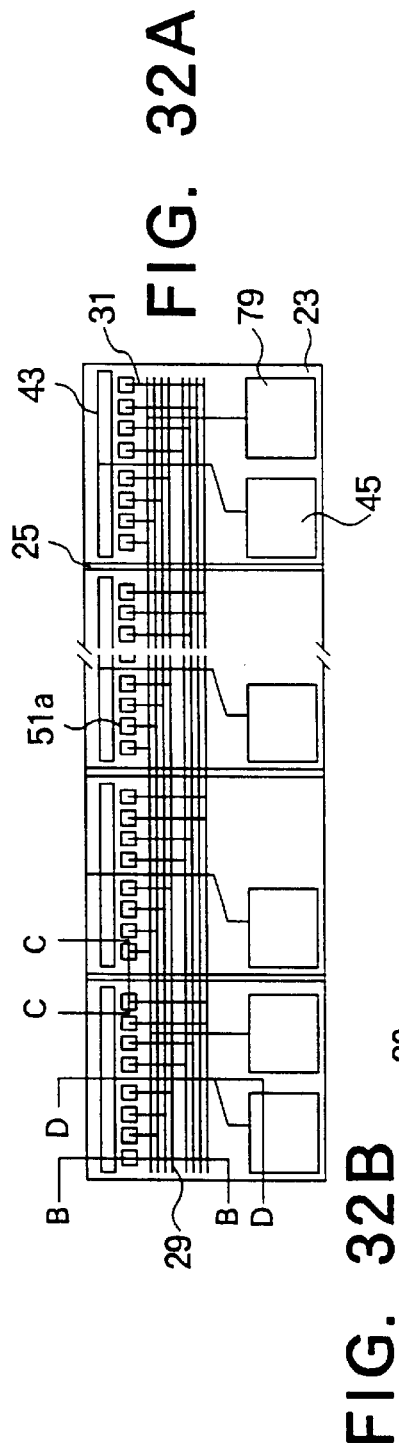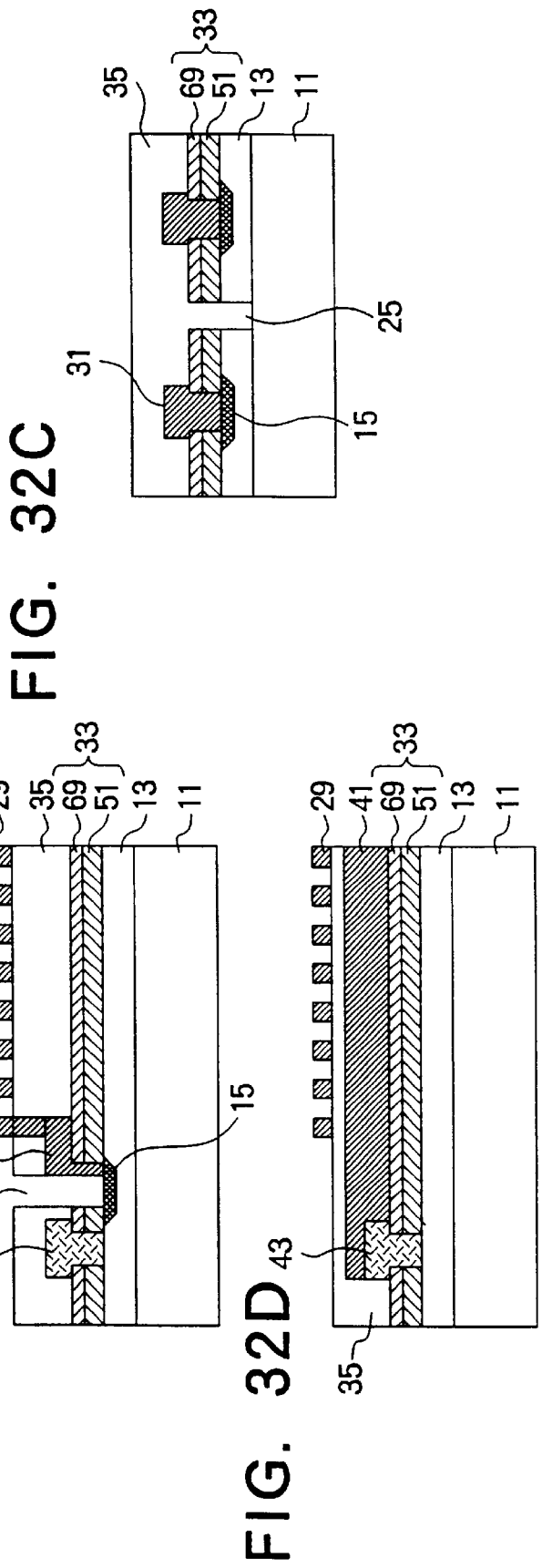

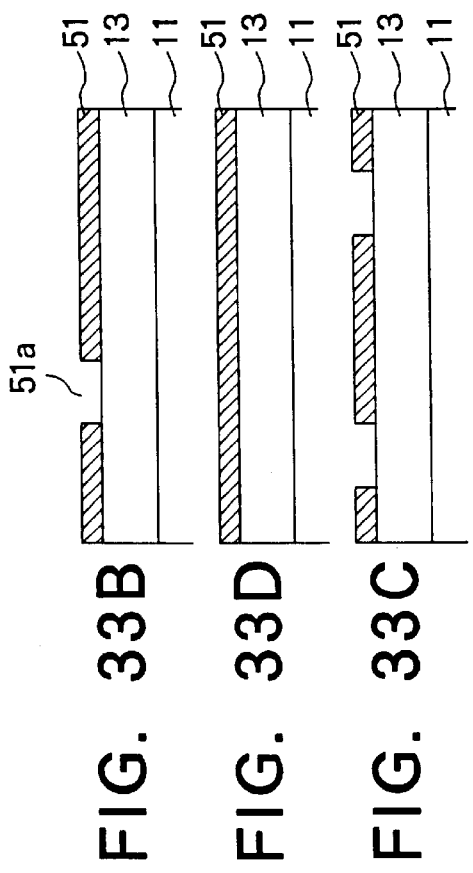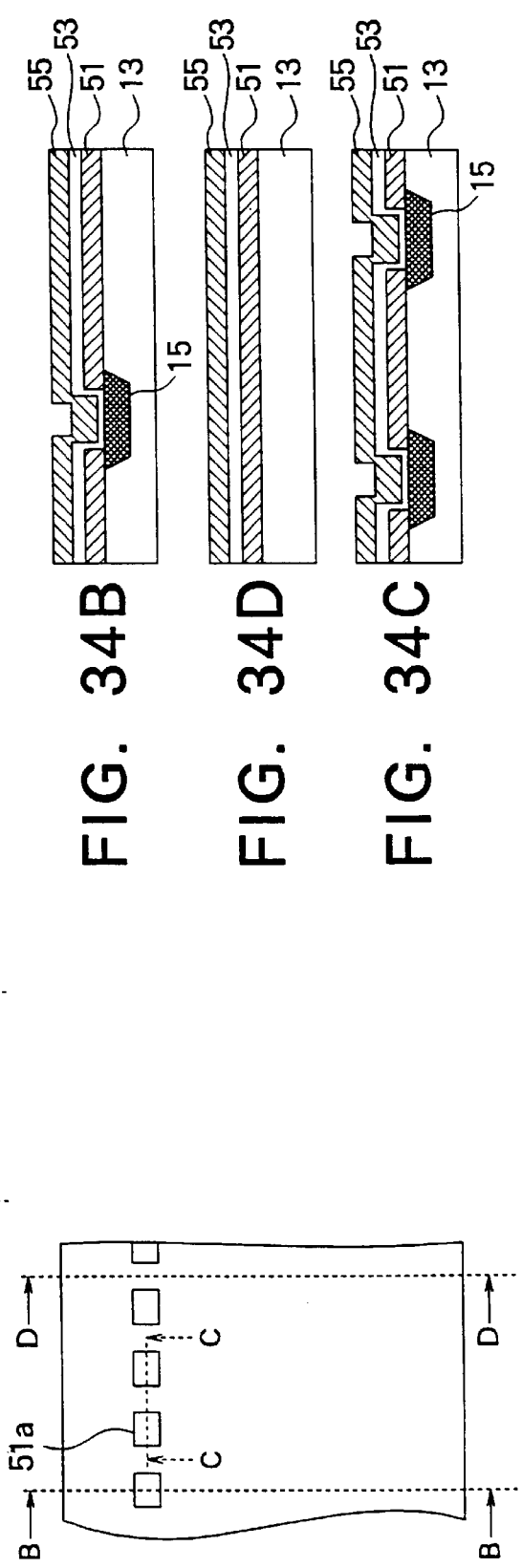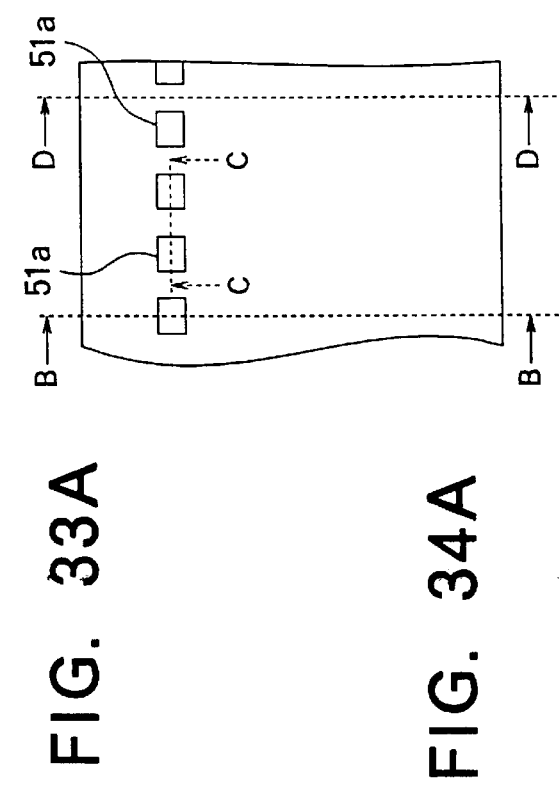

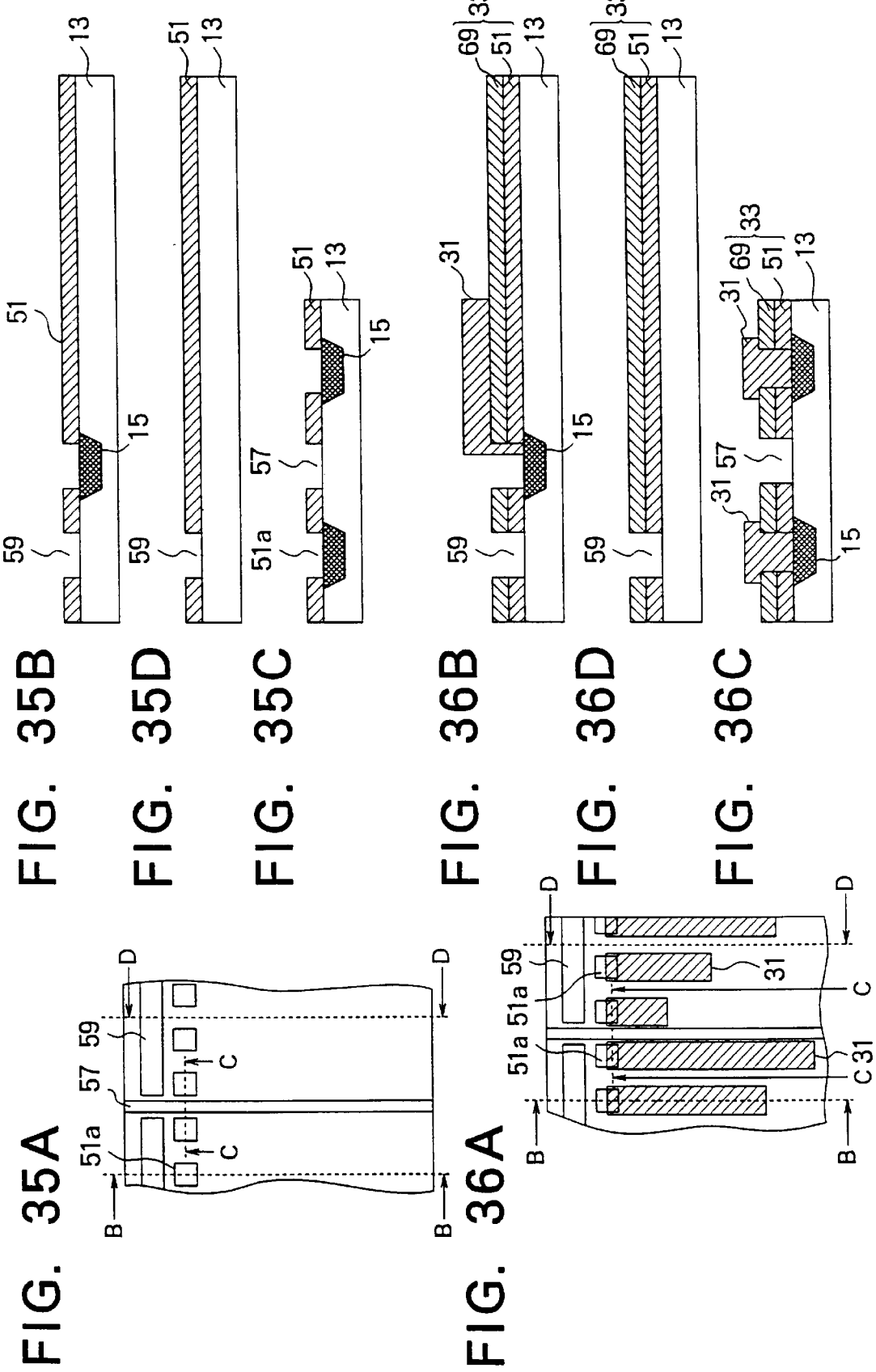

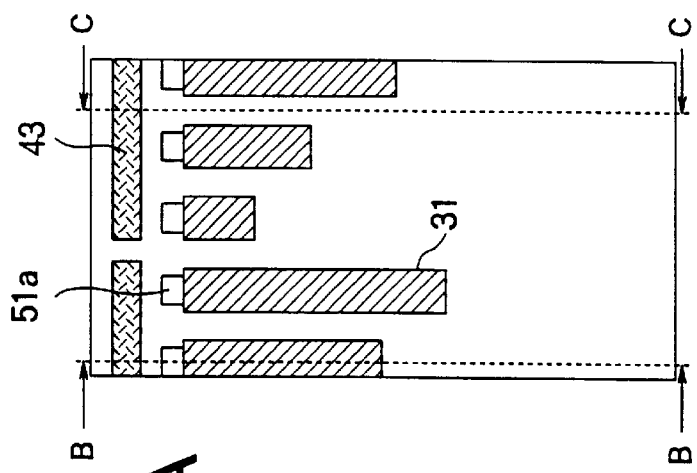
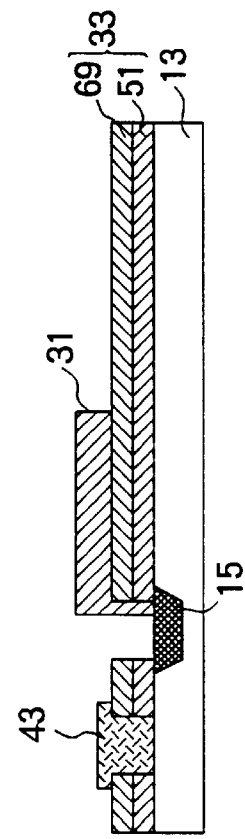
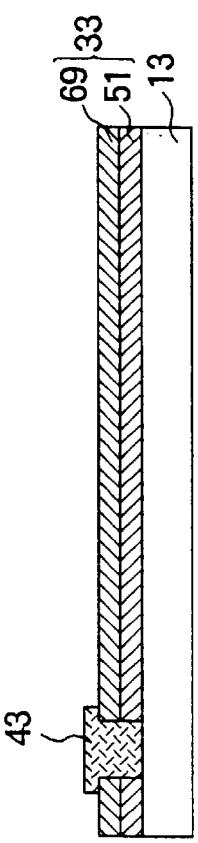
FIG. 37A
FIG. 37B
FIG. 37C

LOW-COST, HIGH-DENSITY LIGHT-EMITTING-DIODE ARRAY AND FABRICATION METHOD THEREOF

This application is a continuation of Ser. No. 09,359,789 filed Jul. 26, 1999 now U.S. Pat. No. 6,190,935 which is a divisional of Ser No. 08,900,064 filed Jul. 23, 1999 now U.S. Pat. No. 5,955,747.

BACKGROUND OF THE INVENTION

The present invention relates to a light-emitting-diode array and a fabrication method thereof, more particularly to an inexpensive method of fabricating a high-density light-emitting-diode array.

A light-emitting diode (also referred to as an LED) is basically a pn junction. It is known technology to fabricate a light emitting-diode array by diffusing a p-type impurity such as zinc through a diffusion mask having multiple diffusion windows into an n-type semiconducting substrate such as n-type gallium arsenide (GaAs). In conventional light-emitting diode arrays, the underside of the substrate is coated with a metal film that serves as a common cathode electrode, and an individual metal anode electrode is provided for each light-emitting diode on the upper side. The anode electrode pattern for each light-emitting diode comprises a comparatively large bonding pad, formed on the diffusion mask, or on an inter-layer insulating film, and a narrower line connecting the bonding pad to the light-emitting diode. The bonding pads are coupled by wire bonding to a separate integrated circuit (IC) that drives the light-emitting-diode array. Arrays of this type with a single row of light-emitting diodes are used as light sources in electrophotographic printers.

With the electrode structure described above, however, the density of the light-emitting diodes is limited by the density with which the bonding pads can be laid out and the bonding wires attached. Even by placing the bonding pads on alternate sides of the row of light-emitting diodes, it is difficult to achieve densities as high as twelve hundred light-emitting diodes per inch (1200 dpi), or higher, which are desired densities for high-quality printing. Moreover, even if a light-emitting-diode array of this density could be fabricated, connecting the array to its driver ICs by wire bonding would present a difficult and perhaps insurmountable challenge.

To overcome this problem, Japanese Kokai Patent Publication No. 152873/1987 discloses a matrix driving scheme in which the light-emitting diodes are divided into groups, each group being formed in a separate n-type well in a p-type substrate. Each n-type well is coupled through an npn bipolar transistor to the common cathode electrode of the array. This arrangement reduces the number of bonding pads, but the bipolar transistors add considerably to the size, complexity, and fabrication cost of the array.

Japanese Kokai Patent Publication No. 177478/1988 discloses a matrix driving scheme in which each light-emitting diode is disposed in an individual mesa of semiconductor material that is electrically isolated from the substrate. This scheme causes planarization problems, which can lead to electrical discontinuities in electrode lines.

Japanese Kokai Utility Patent Publication No. 170142/1988 discloses a matrix scheme in which the light-emitting-diode array is divided into sections that are electrically isolated from one another by intervening layers of a dielectric material. This type of dielectric isolation requires extra fabrication process steps, and is not easily achieved at a low cost.

SUMMARY OF THE INVENTION

It is accordingly an object of the present invention to provide a low-cost matrix-driven light-emitting-diode array.

Another object of the invention is to provide a low-cost fabrication method for a matrix-driven light-emitting-diode array.

Still another object is to reduce the size of a light-emitting-diode array.

Yet another object is to increase the number and density of the light-emitting diodes in a light-emitting-diode array.

A further object is to assure electrical continuity in the electrode lines of a matrix-driven light-emitting-diode array.

A still further object is to assure uniform light-emission characteristics of the light-emitting diodes in a matrix-driven light-emitting-diode array.

The invented light-emitting-diode array is fabricated on a substrate having a lower layer of an insulating or semi-insulating material and an upper layer of an n-type or p-type semiconducting material. The upper layer is divided into blocks by isolation channels that extend from the upper surface of the upper layer entirely through the upper layer. The blocks are electrically isolated from one another by these isolation channels. Each block has a block electrode that makes electrical contact with the upper layer in the block.

A row of light-emitting diodes is formed by selective diffusion of an impurity into the upper layer. Each block of the upper layer includes a plurality of these light-emitting diodes. The row of light-emitting diodes is paralleled by a plurality of shared lines, each of which is electrically coupled to a plurality of light-emitting diodes disposed in different blocks. Each light emitting diode is electrically coupled to just one of the shared lines.

The isolation channels may have a rectangular cross-sectional shape, or a trapezoidal cross-sectional shape that is widest at the top of the upper layer. Alternatively, the isolation channels may have a rectangular cross-sectional shape where they pass through the row of light-emitting diodes, and a trapezoidal cross-sectional shape where crossed by the shared lines. The isolation channels may be filled with an insulating material, for planarization and for enhanced electrical isolation.

The shared lines are coupled to the light-emitting diodes by individual lines which are separated from the shared lines by an inter-layer insulating film. If the shared lines are formed below this inter-layer insulating film, the shared lines are preferably plated to prevent oxidation and assure good electrical contact with the individual lines. If the individual lines are formed below this inter-layer insulating film, the individual lines are similarly plated.

The block electrodes and individual lines are preferably sintered to assure good electrical contact with the upper layer of the substrate and with the light-emitting diodes. The block electrodes are coupled by block lines to block bonding pads. The block lines and block bonding pads are preferably formed after the sintering of the block electrodes and individual lines.

Each shared line is coupled to at least one shared-line bonding pad. The shared-line bonding pads and block bonding pads are preferably aligned in a straight or zig-zag row on one side of the row of light-emitting diodes. If necessary, however, the shared-line bonding pads and block bonding pads may be disposed on opposite sides of the row of light-emitting diodes.

The invented light-emitting-diode array can be fabricated at a low cost because the isolation channels can be formed by standard photolithography and etching. The size of the array can be reduced by aligning all bonding pads in a single row. The number of light-emitting diodes can be increased, while maintaining uniform light-emitting characteristics, by providing more than one bonding pad per shared line. The density of the light-emitting diodes can be increased, as compared with conventional non-matrix arrays, because it is not necessary to provide a separate bonding pad for each light-emitting diode. Electrical continuity of the shared lines can be assured by appropriate design of the cross-sectional shape of the isolation channels where the shared lines cross these channels, or by filling in the isolation channels.

BRIEF DESCRIPTION OF THE DRAWINGS

In the attached drawings:

FIG. 30A is a plan view illustrating a further stage in this fabrication process;

FIGS. 30B and 30C are sectional views through lines B—B and C—C, respectively, in FIG. 30A;

FIG. 32A is a plan view of a sixth embodiment of the invented light-emitting-diode array;

FIGS. 32B, 32C, and 32D are sectional views through lines B—B, C—C, and D—D, respectively, in FIG. 32A;

FIG. 33A is a plan view illustrating a stage in the fabrication process of the sixth embodiment;

FIGS. 33B, 33C, and 33D are sectional views through lines B—B, C—C, and D—D, respectively, in FIG. 33A;

FIG. 34A is a plan view illustrating a further stage in this fabrication process;

FIGS. 34B, 34C, and 34D are sectional views through lines B—B, C—C, and D—D, respectively, in FIG. 34A;

FIG. 35A is a plan view illustrating a further stage in this fabrication process;

FIGS. 35B, 35C, and 35D are sectional views through lines B—B, C—C, and D—D, respectively, in FIG. 35A;

FIG. 36A is a plan view illustrating a further stage in this fabrication process;

FIGS. 36B, 36C, and 36D are sectional views through lines B—B, C—C, and D—D, respectively, in FIG. 36A;

FIG. 37A is a plan view illustrating a further stage in this fabrication process;

FIGS. 37B and 37C are sectional views through lines B—B and C—C, respectively, in FIG. 37A;

DETAILED DESCRIPTION OF THE INVENTION

Figure 1A:
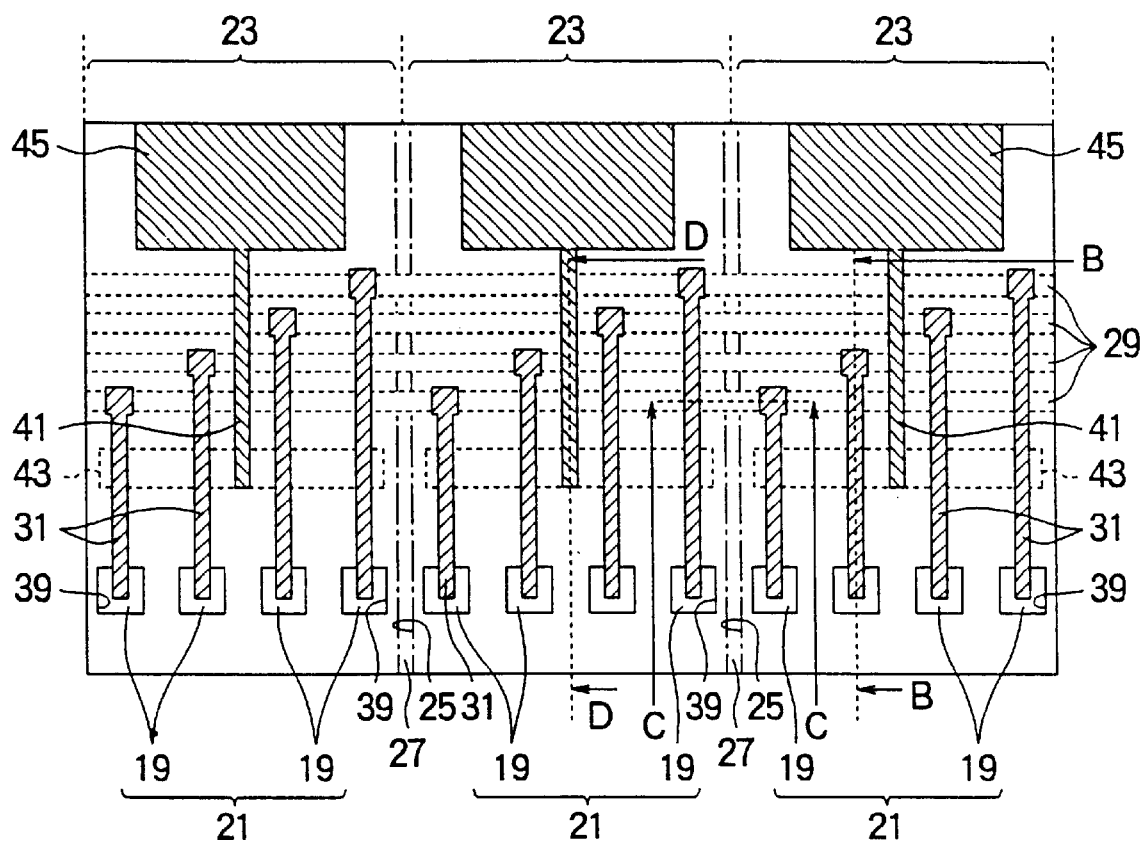
FIG. 1A is a plan view of an example of the basic structure of the invented light-emitting-diode array.

Embodiments of the invention will be described with reference to the attached illustrative drawings. When the same component element appears in different drawings, the same reference numeral will be used, and repeated descriptions will generally be omitted.

The drawings do not attempt to show the exact shapes, sizes, or positional relationships of the component elements, and where thicknesses or other dimensions are mentioned in the descriptions, the values mentioned are given only as examples. Fabrication process parameters and materials are also given only as examples. These examples are not intended to limit the scope of the invention.

First, an example of the basic configuration of the invented light-emitting-diode array will be described with reference to FIGS. 1A, 1B, 1C, and 1D.

Figure 1B:
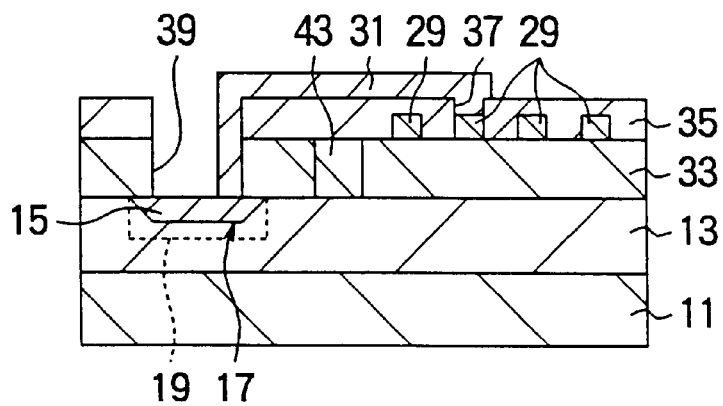
FIGS. 1B, 1C, and 1D are sectional views through lines B—B, C—C, and D—D, respectively, in FIG. 1A.

Referring to FIG. 1B, the invented light-emitting-diode array is fabricated on a substrate comprising an insulating or semi-insulating lower layer 11 and a semiconducting upper layer 13. An impurity is selectively diffused into the upper layer 13 to form a row of island-like diffusion areas 15, each extending through part of the thickness of the upper layer 13. The row of diffusion areas 15 is oriented perpendicular to the paper in FIG. 1B, which thus shows only one diffusion area 15.

The upper layer 13 and diffusion areas 15 are of opposite semiconducting types, so pn junctions 17 are formed at the interfaces between them. One diffusion area 15, pn junction 17, and the immediately adjacent part of the upper layer 13 constitute a single light-emitting diode 19. The light-emitting diodes 19 are disposed at regular intervals, as can be seen in FIG. 1A.

Figure 1C:
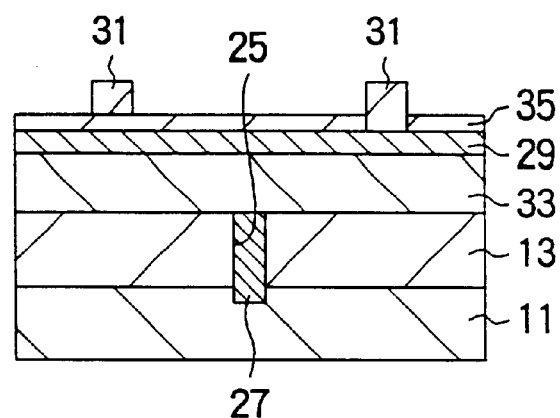

The row of light-emitting diodes 19 is divided into light-emitting-diode groups 21, each having the same number of light-emitting diodes 19. In this example, each group 21 has four light-emitting diodes 19. The upper layer 13 is similarly divided into blocks 23, which are electrically isolated from one another by isolation channels 25. Each block 23 contains one light-emitting-diode group 21. The isolation channels 25 are grooves that cut completely through the upper layer 13, as can be seen in FIG. 1C. The isolation channels 25 may be filled with an insulating material 27, for planarization and for enhanced electrical isolation, but this insulating material 27 is not always necessary, and when this insulating material 27 is present, it can be used for electrical isolation without complete planarization.

Running parallel to the row of light-emitting diodes 19 are a plurality of shared lines 29, equal in number to the number of light-emitting diodes 19 per group 21. Each shared line 29 is coupled by individual lines 31 to one light-emitting diode 19 in each group 21. Conversely, each light-emitting diode 19 is coupled by an individual line 31 to just one shared line 29. It is convenient for each shared line 29 to be coupled to light-emitting diodes 19 in the same ordinal position in each group 21. In FIG. 1A, for example, one shared line 29 is coupled to the leftmost light-emitting diode 19 in each group 21, another shared line 29 is coupled to the second light-emitting diode 19 from the left in each group, another shared line 29 is coupled to the third light-emitting diode 19 from the left in each group, and the fourth shared line 29 is coupled to the rightmost light-emitting diode 19 in each group.

As can be seen in FIG. 1B, the shared lines 29 are insulated from the upper layer 13 by a first inter-layer insulating film 33, and from the individual lines 31 by a second inter-layer insulating film 35. One end of each individual line 31 makes contact with a shared line 29 through a via hole 37 in the second inter-layer insulating film 35. The other end of the individual line 31 makes contact with the surface of the diffusion area 15 in a light-emitting diode 19, through an opening 39 in the first and second inter-layer insulating films 33 and 35.

Figure 1D:
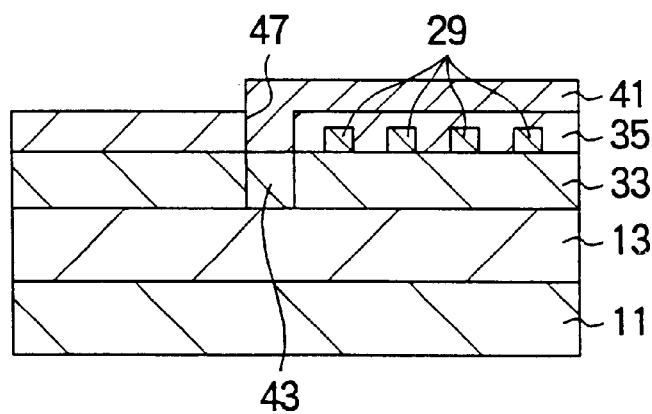

Referring again to FIG. 1A, each block 23 has a block line 41 that connects a block electrode 43 to a block bonding pad 45. Referring to FIG. 1D, the block electrode 43 is formed in an opening in the first inter-layer insulating film 33, and makes ohmic electrical contact with the upper layer 13. The block line 41 is formed on the second inter-layer insulating film 35, and makes contact with the block electrode 43 through a via hole 47 in the second inter-layer insulating film 35. The block bonding pad 45 is also formed on the second inter-layer insulating film 35. One bonding pad (not visible) is also provided for each shared line 29.

The invented light-emitting diode array is driven by a matrix scheme in which the shared lines 29 are driven in turn. When a shared line 29 is driven, the light-emitting diodes 19 coupled to that shared line 29 are turned on or off according to the voltages applied to the block bonding pads 45. Matrix driving has the advantage of avoiding the excessive power-line noise that might occur if all light-emitting diodes 19 in the array were to be driven simultaneously.

An attendant advantage is that the density of the light-emitting diodes is not limited by the spacing or density of the bonding pads. Aside from the bonding pads for the shared lines 29, only one block bonding pad 45 is required for each group 21 of light-emitting diodes, so the density can be increased simply by increasing the number of light-emitting diodes per group. A 1200-dpi light-emitting-diode array can easily be fabricated and wire-bonded by using sufficiently large groups 21 of light-emitting diodes.

A further advantage is that all of the bonding pads can be placed on the same side of the array. This enables the light-emitting-diode array to be driven by a single driver IC, instead of requiring two driver ICs, one on each side of the array.

These advantages are furthermore obtained without resort to complex structures or difficult fabrication processes. No transistors have to be formed in the light-emitting-diode array, and the isolation channels 25 can be created by a simple photolithography and etching process, which will be described later. The invented light-emitting-diode array can therefore be fabricated at a low cost.

Next, a few variations in the basic structure will be mentioned. These variations will be illustrated in the embodiments below.

In a plane parallel to the row of light-emitting diodes 19 (i.e. parallel to the array direction) and perpendicular to the upper surface of the upper layer 13, the isolation channels 25 may have either a rectangular cross section, as shown in FIG. 1C, or a trapezoidal cross section. The rectangular cross section has the advantage of saving space, but the trapezoidal cross section has the advantage of reducing the need for planarization. The isolation channels 25 can also be given a rectangular cross section where they pass through the row of light-emitting diodes, and a trapezoidal cross section where they are crossed by the shared lines 29, to obtain both advantages.

The individual lines 31 can be formed between the first and second inter-layer insulating films 33 and 35, and the shared lines 29 on the second inter-layer insulating film 35, instead of vice versa.

Figure 2:
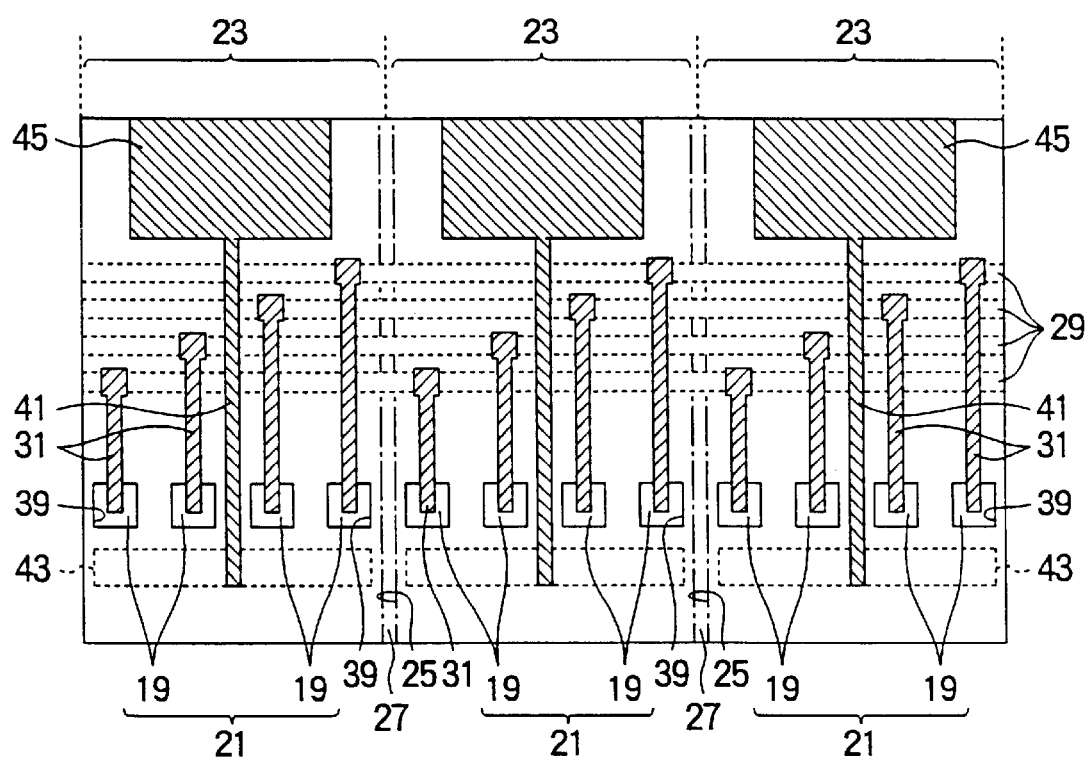
FIG. 2 is a plan view showing a variation of the basic structure in FIG. 1A.
Figure 3:
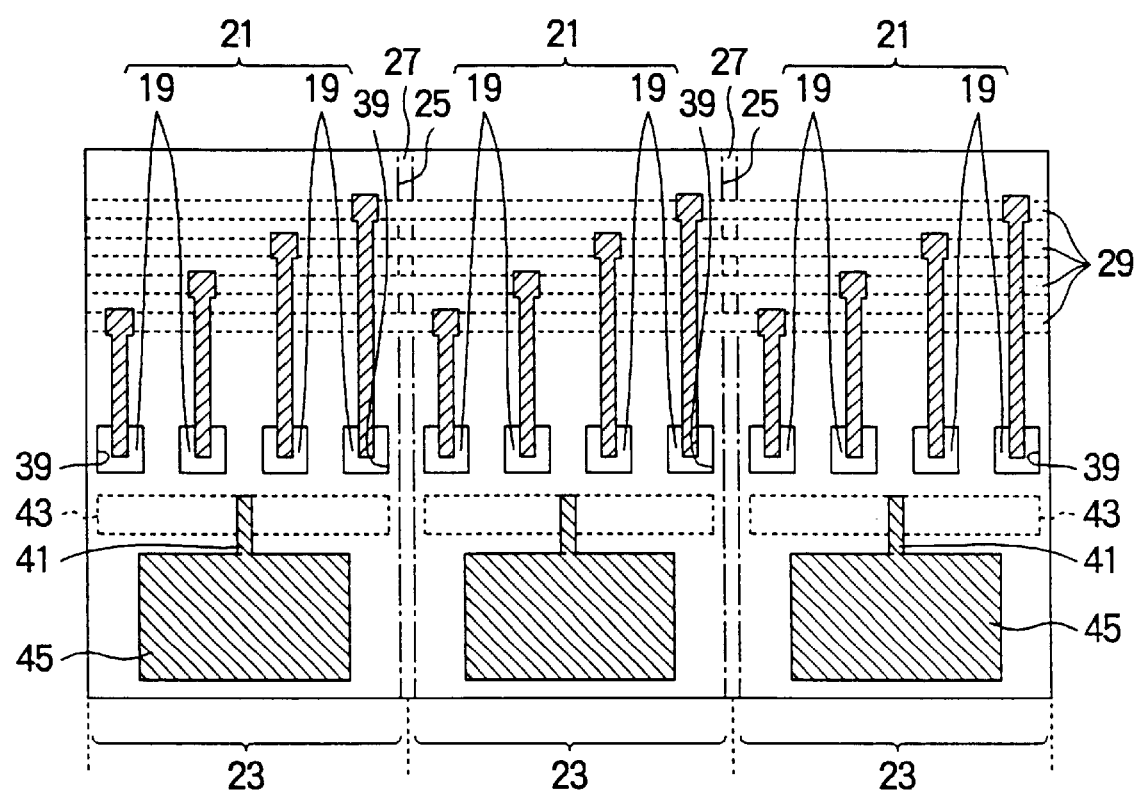
FIG. 3 is a plan view showing another variation of the basic structure in FIG. 1A.

The block electrodes 43 can be moved to the opposite side of the row of light-emitting diodes from the shared lines 29, as shown in FIG. 2. The block bonding pads 45 for the block electrodes 43 can also be moved to that side of the row of light-emitting diodes, as shown in FIG. 3.

The shared lines 29 can have more than one bonding pad each. Alternatively, each shared line can be divided into two or more discontinuous sections, with at least one bonding pad per section.

First Embodiment

The structure of a light-emitting-diode array according to a first embodiment of the invention will be described with reference to FIGS. 4A, 4B, 4C, 4D, and 4E. The first embodiment has the basic structure already illustrated in FIGS. 1A, 1B, 1C, and 1D, so repeated descriptions of basic features will be omitted.

In this first embodiment, the lower layer 11 of the substrate is a layer of semi-insulating GaAs, while the upper layer 13 is an epitaxial layer of n-type GaAs. The diffusion areas 15 are p-type areas formed by solid-phase diffusion of zinc into the upper layer 13. The thickness of the upper layer 13 is approximately four micrometers (4 $\mu$m); the diffusion depth of the diffusion areas 15 is approximately one micrometer (1 $\mu$m). The distance from the pn junctions 17 to the lower layer 11 is therefore approximately 3 $\mu$m. During operation, the mean free path of holes injected into the upper layer 13 from the diffusion areas 15 is approximately 2 $\mu$m. The light-emitting efficiency of the light-emitting diodes 19 is therefore substantially unaffected by the presence of the semi-insulating lower layer 11.

Figure 4A:
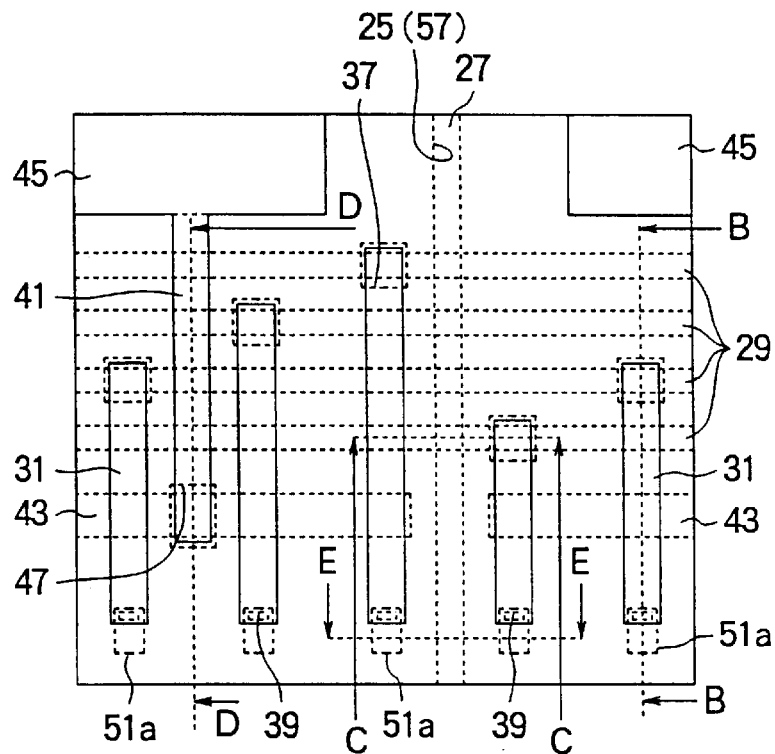
FIG. 4A is a plan view of a first embodiment of the invented light-emitting-diode array.
Figure 4B:
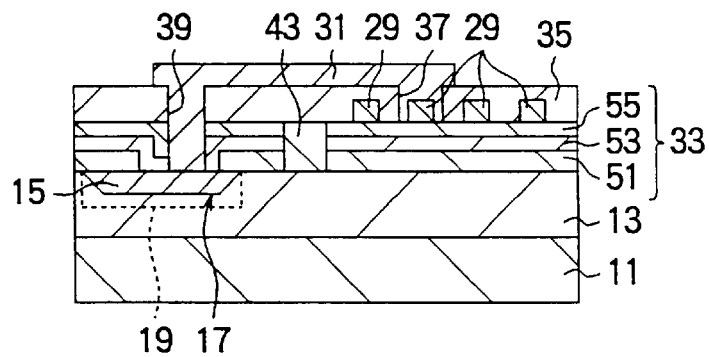
FIGS. 4B, 4C, 4D, and 4E are sectional views through lines B—B, C—C, D—D, and E—E, respectively, in FIG. 4A, with FIG. 4E showing diffusion areas and an isolation channel, while not showing an insulating film.

Referring to FIG. 4B, the solid-phase diffusion process that forms the diffusion areas 15 employs a diffusion mask 51, a diffusion-source film 53, and an anneal-cap film 55, which are left in place after the diffusion process to function as the first inter-layer insulating film 33. The diffusion mask 51 comprises aluminum nitride (AlN). The diffusion-source film 53 comprises a mixture of zinc oxide (ZnO) and silicon dioxide ($SiO_2$). The anneal-cap film 55 comprises silicon nitride (SiN) or AlN. The second inter-layer insulating film 35 comprises SiN.

These materials (AlN, SiN, and $SiO_2$ mixed with ZnO) are all substantially transparent to light of the wavelength emitted by the light-emitting diodes 19. The combined thickness of the first and second inter-layer insulating films 33 and 35 is moreover less than one micrometer (1 $\mu$m). Light can accordingly be emitted through the first and second inter-layer insulating films 33 and 35 with substantially no loss of intensity, even if the openings 39 above the diffusion areas 15 are completely filled by the individual lines 31, as they are in this embodiment. If necessary, however, the first and second inter-layer insulating films 33 and 35 may be removed from the areas through which light is emitted.

Referring to FIG. 4A, the diffusion mask 51 has diffusion windows 51a that determine the shape of the diffusion areas 15. (To simplify the drawing, the extent of the diffusion areas 15 is not indicated in FIG. 4A. The outlines of the diffusion-source film 53 and anneal-cap film 55 are also omitted from this drawing.)

The shared lines 29, individual lines 31, block lines 41, and block bonding pads 45 all comprise aluminum (Al). Referring again to FIG. 4B, the upper surfaces of the shared lines 29 are plated with nickel (Ni), which prevents oxidation and thereby assures good electrical contact with the individual lines 31. Referring to FIG. 4D, the block electrodes 43 comprise a gold alloy, which makes good electrical contact with both the aluminum block lines 41 and the n-type GaAs material of the upper layer 13.

Figure 4C:
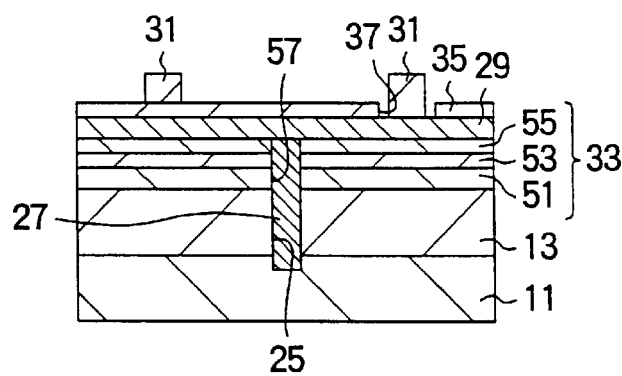
Figure 4D:
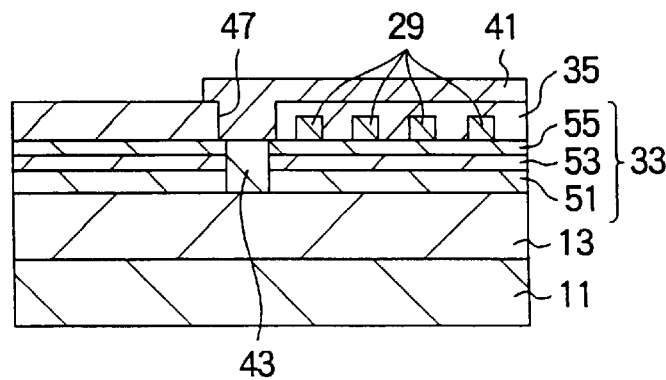

Referring to FIG. 4C, the isolation channels 25 have a rectangular cross section, and are filled with polyimide as an insulating material 27. As will be explained later, the isolation channels 25 are formed by creating openings 57 in the first inter-layer insulating film 33, then etching through the upper layer 13 where exposed by these openings 57. The openings 57 are also filled with polyimide.

The width of the isolation channels 25 is constrained by the density of the light-emitting diodes 19 and the width of the diffusion areas 15 in the array direction. Enough space should be left between the diffusion areas 15 and isolation channels 25 so that the light-emitting characteristics of the light-emitting diodes 19 are not affected by the isolation channels 25; otherwise, the light-emitting diodes adjacent the isolation channels 25 will emit light differently from the other light-emitting diodes. In general, the distance from the isolation channels 25 to the adjacent light-emitting diodes 19 should not be less than the approximately 2-$\mu$m mean free path of holes injected into the upper layer 13 from the diffusion areas 15.

Figure 4E:
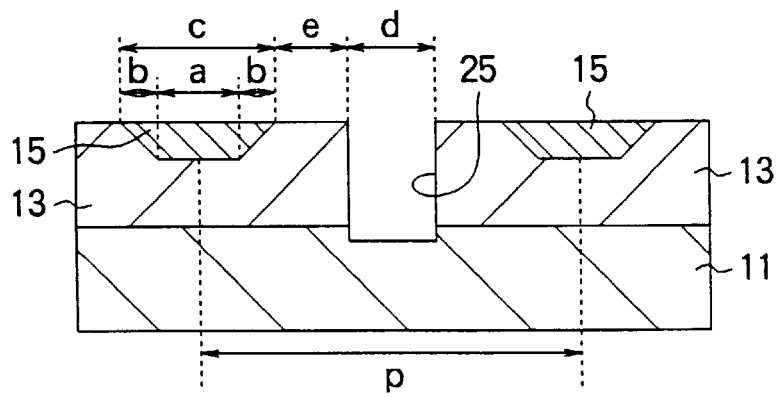

Referring to FIG. 4E, if the density of the light-emitting diodes 19 is 1200 dpi, then the diode pitch (p) is approximately 21 $\mu$m. If the width (a) of the diffusion windows (not shown) in the array direction is 5 $\mu$m and the lateral diffusion distance (b) of the zinc impurity is 1.5 $\mu$m, then the width (c) of the diffusion areas 15 in the upper surface of the upper layer 13 in the array direction is 8 $\mu$m. Accordingly, if the width (d) of the isolation channels 25 in the array direction is 5 $\mu$m, a distance (e) of approximately 4 $\mu$m is left between the diffusion areas 15 and the isolation channel 25, exceeding the above-mentioned mean free path (2 $\mu$m) by a comfortable margin.

The isolation channels 25 may have any depth that is great enough to penetrate completely through the upper layer 13, but not so great as to prevent the isolation channels 25 from being filled with the insulating material 27. When polyimide is employed as the insulating material 27, the isolation channels 25 can be completely filled even if their depth exceeds their width, provided their aspect ratio (depth/width) is not too high. If the width (d) of the isolation channels 25 is 5 $\mu$m, and the thickness of the upper layer is 4 $\mu$m, then depth of the isolation channels 25, as measured from the top of the upper layer 13, can be 6 $\mu$m, for example. Even if the thickness of the first inter-layer insulating film 33 is considered, the combined aspect ratio of the isolation channels 25 and openings 57 is close enough to unity for the isolation channels 25 to be completely filled with polyimide.

Referring again to FIG. 4C, since the openings 57 in the first inter-layer insulating film 33 are filled with the polyimide insulating material 27, the surface of the first inter-layer insulating film 33 is planarized, permitting the shared lines 29 to pass over the isolation channels 25 without irregularities and without risk of the formation of electrical discontinuities.

Next, a fabrication method for the first embodiment will be described with reference to FIGS. 5A to 13C.

Figure 5A:
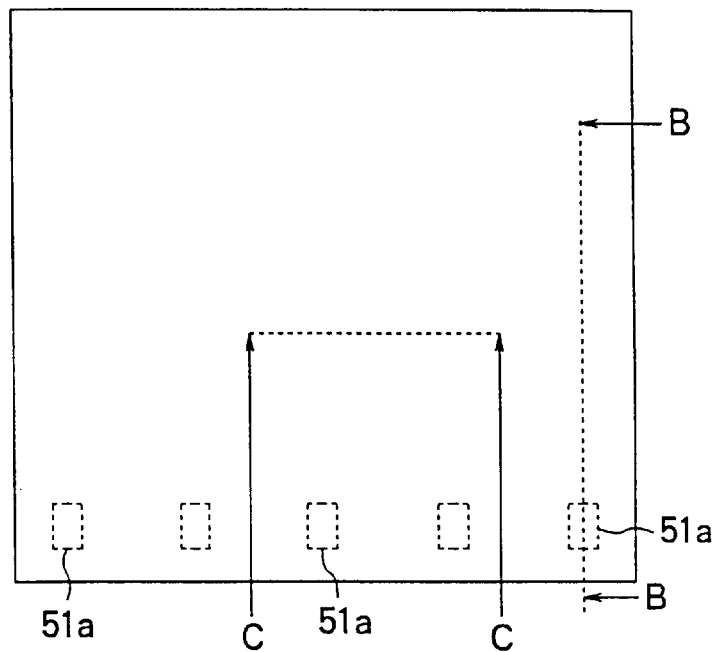
FIG. 5A is a plan view illustrating a stage in the fabrication process of the first embodiment.
Figure 5B:
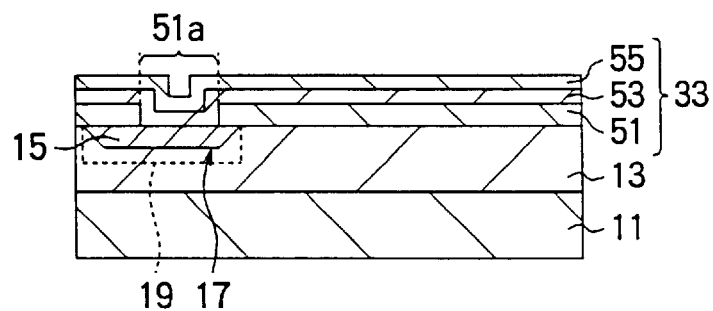
FIGS. 5B and 5C are sectional views through lines B—B and C—C, respectively, in FIG. 5A.
Figure 5C:
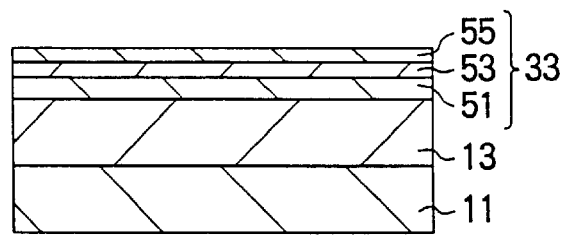
Figure 6A:
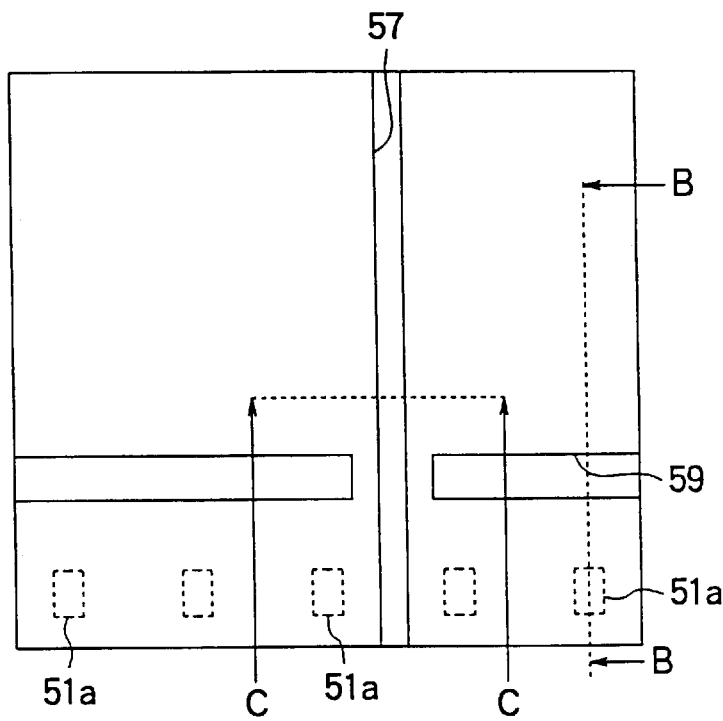
FIG. 6A is a plan view illustrating a further stage in this fabrication process.
Figure 6B:
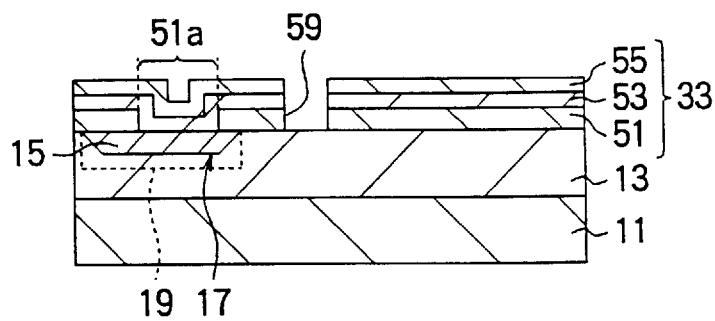
FIGS. 6B and 6C are sectional views through lines B—B and C—C, respectively, in FIG. 6A.
Figure 6C:
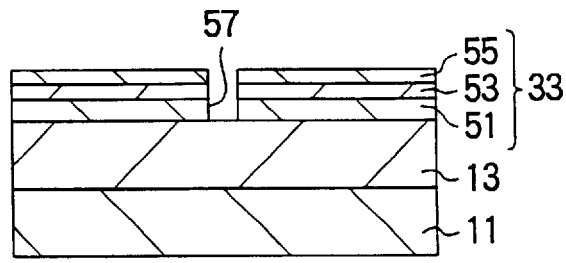
Figure 7A:
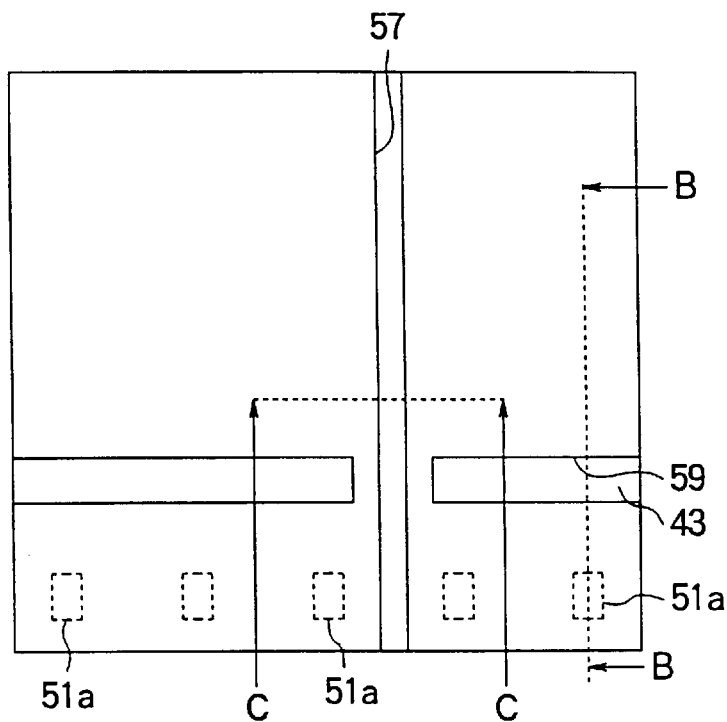
FIG. 7A is a plan view illustrating a further stage in this fabrication process.
Figure 7B:
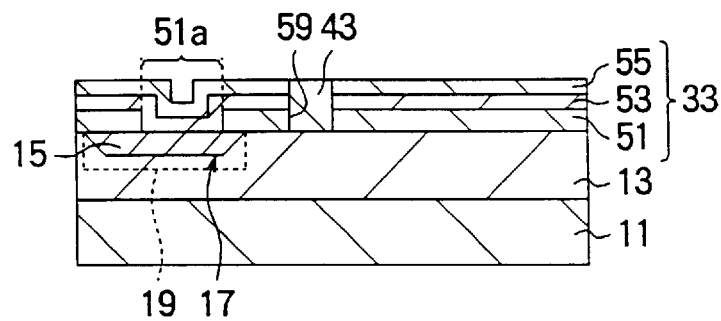
FIGS. 7B and 7C are sectional views through lines B—B and C—C, respectively, in FIG. 7A.
Figure 7C:
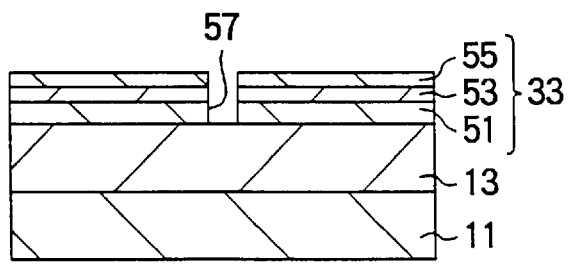
Figure 8A:
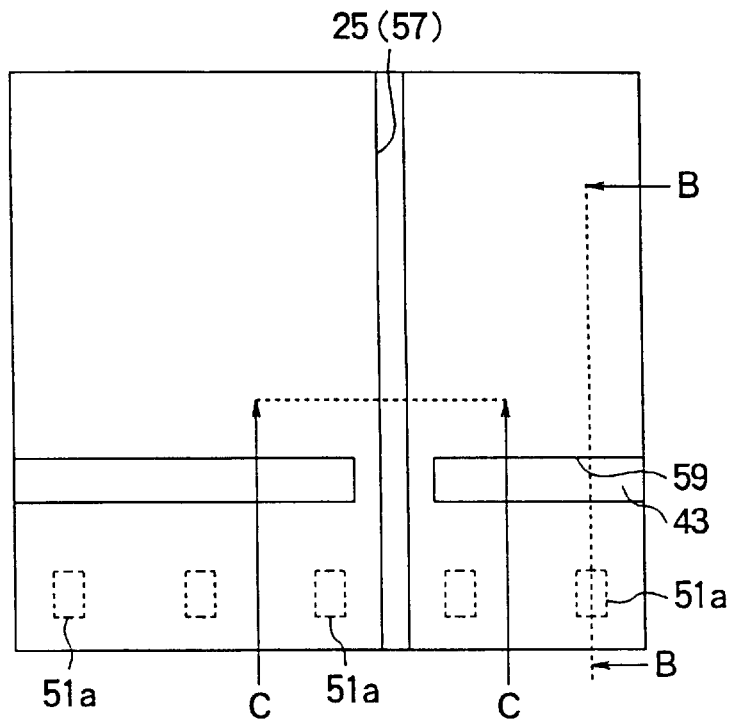
FIG. 8A is a plan view illustrating a further stage in this fabrication process.
Figure 8B:
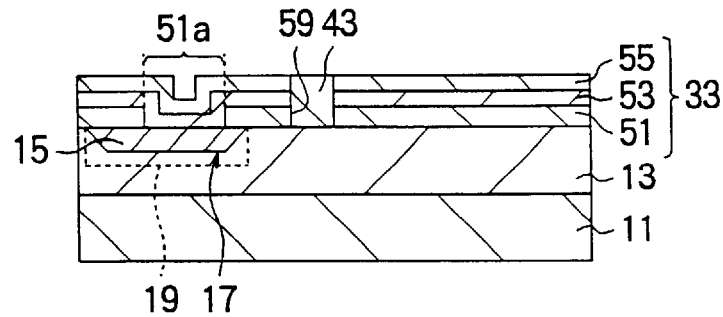
FIGS. 8B and 8C are sectional views through lines B—B and C—C, respectively, in FIG. 8A.
Figure 8C:
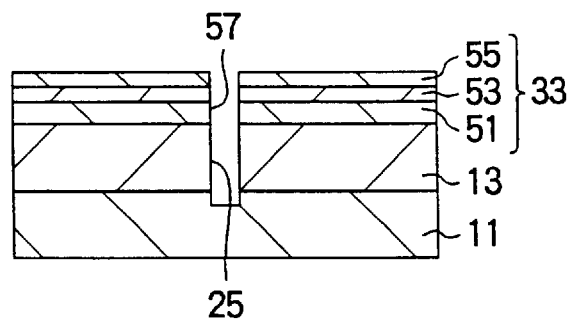

The fabrication process starts from a wafer of semi-insulating GaAs, which forms the lower layer 11. Referring to FIG. 5O, an upper layer 13 of n-type GaAs, substantially 4 $\mu$m thick, is epitaxially grown on this lower layer 11, then a diffusion mask 51, diffusion-source film 53, and anneal-cap film 55 are sequentially deposited on the upper layer 13. Referring to FIGS. 5B and 5A, the diffusion mask 51 is patterned by standard photolithographic and etching methods to form diffusion windows 51a before the diffusion-source film 53 and anneal-cap film 55 are deposited.

The diffusion mask 51 is formed by sputtering of A1N, and has a thickness of, for example, two thousand angstroms (2000 Å). The diffusion-source film 53 is formed by sputtering of a mixture of ZnO and $SiO_2$, and has a film thickness in the range from 200 Å to 2000 Å. The anneal-cap film 55 has a thickness in this same range of 200 Å to 2000 Å. If made of SiN, the anneal-cap film 55 can be formed by plasma chemical vapor deposition (CVD); if made of A1N, the anneal-cap film 55 can be formed by sputtering.

The wafer is now placed in an oven and annealed in a nitrogen atmosphere under conditions that cause zinc to diffuse from the diffusion-source film 53 through the diffusion windows 51a to a depth of substantially 1 $\mu$m in the upper layer 13. This annealing process forms the diffusion areas 15 and produces the state illustrated in FIGS. 5A to 5C. The annealing conditions should be selected according to the thicknesses of the diffusion mask 5, diffusion-source film 53, and anneal-cap film 55, the combination of materials employed, and the shape of the diffusion windows 51a. For the film materials and thicknesses given above, annealing for two hours at a temperature of substantially 700° C. is appropriate.

After the annealing is completed, the diffusion mask 51, diffusion-source film 53, and anneal-cap film 55 become the first inter-layer insulating film 33. This first inter-layer insulating film 33 is patterned by photolithography and etching to create groove-like openings 57 over the desired locations of the isolation channels 25, and slot-like openings 59 in the desired locations of the block electrodes 43, leaving the state illustrated in FIGS. 6A, 6B, and 6C.

Next, the wafer is coated with a photoresist (not shown in the drawings), which is patterned to create a mask that exposes only the slot-like openings 59. A gold alloy film is deposited on this mask by electron-beam evaporation, filling the openings 59 and thereby forming the block electrodes 43. The photoresist mask (not shown) and the gold alloy film adhering thereto are then lifted off, leaving the state illustrated in FIGS. 7A, 7B, and 7C.

Next the wafer is coated with another photoresist, which is patterned to create windows above the openings 57, and the isolation channels 25 are formed by dry etching, using this patterned photoresist as an etching mask. The etchant gas is a mixture of boron trichloride ($BCl_3$) and chlorine ($Cl_2$). The dry etching conditions and the dimensions of the windows in the etching mask are controlled to give the isolation channels 25 a rectangular cross section with a depth of 6 $\mu$m and a width of 5 $\mu$m. The etching mask is then removed, leaving the state illustrated in FIGS. 8A, 8B, and 8C.

The block electrodes 43 are formed before the isolation channels 25. If the isolation channels 25 were to be formed first, the wafer might not be evenly coated by the photoresist used in the process of forming the block electrodes 43, leading to imperfect formation of the block electrodes 43.

Figure 9A:
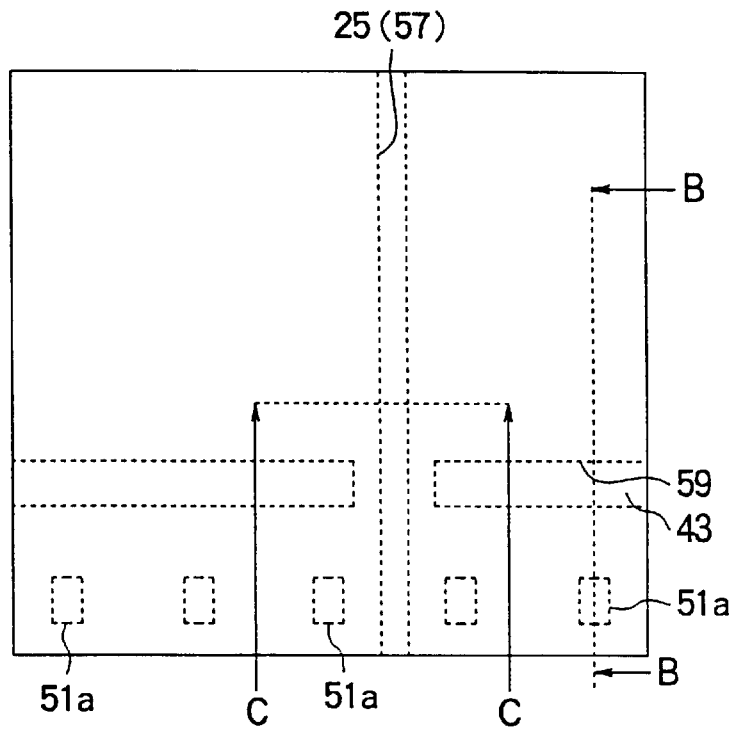
FIG. 9A is a plan view illustrating a further stage in this fabrication process.
Figure 9B:
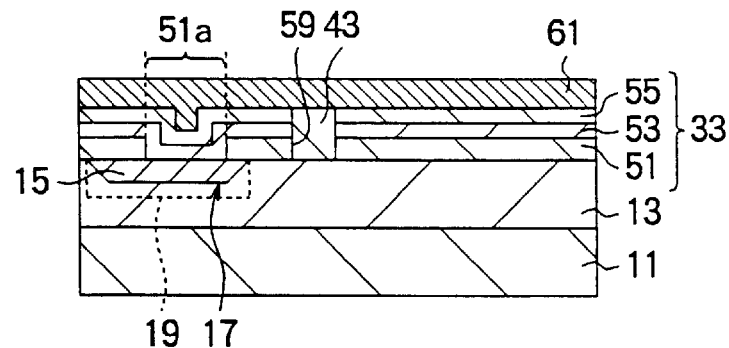
FIGS. 9B and 9C are sectional views through lines B—B and C—C, respectively, in FIG. 9A.
Figure 9C:
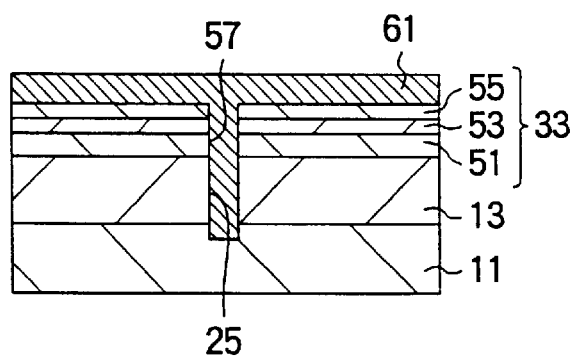
Figure 10A:
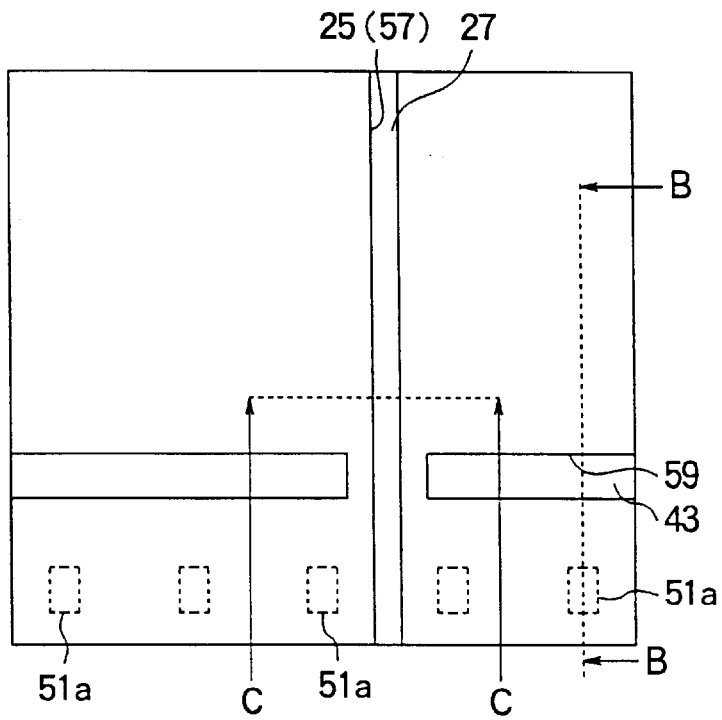
FIG. 10A is a plan view illustrating a further stage in this fabrication process.
Figure 10B:
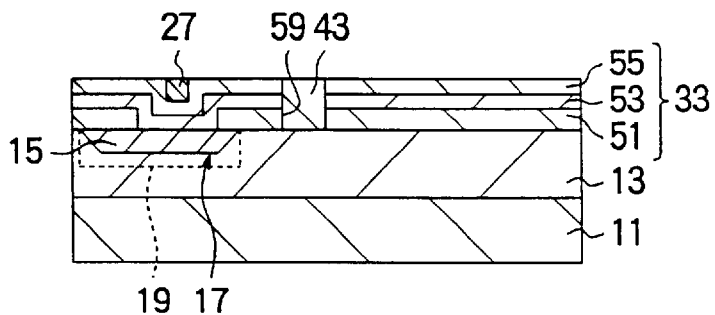
FIGS. 10B and 10C are sectional views through lines B—B and C—C, respectively, in FIG. 10A.
Figure 10C:
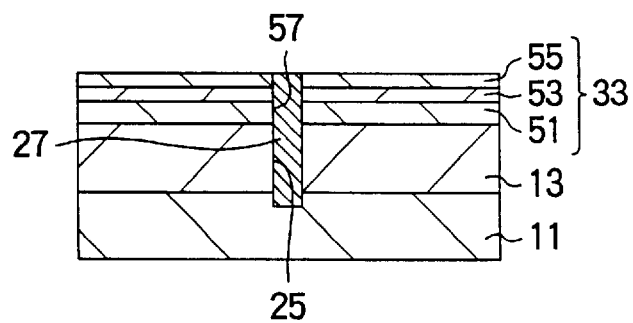

Referring to FIGS. 9A, 9B, and 9C, the wafer is next coated with a layer of polyimide resin 61 thick enough to fill the isolation channels 25, and this polyimide layer 61 is cured by baking, thereby imidizing the layer 61. The imidized layer 61 is then etched back until the top of the first inter-layer insulating film 33 is exposed, as shown in FIGS. 10A, 10B, and 10C, leaving polyimide present only in the openings 57 and isolation channels 25, where the polyimide functions as an insulating material 27. The etched-back wafer surface is substantially planarized.

Figure 11A:
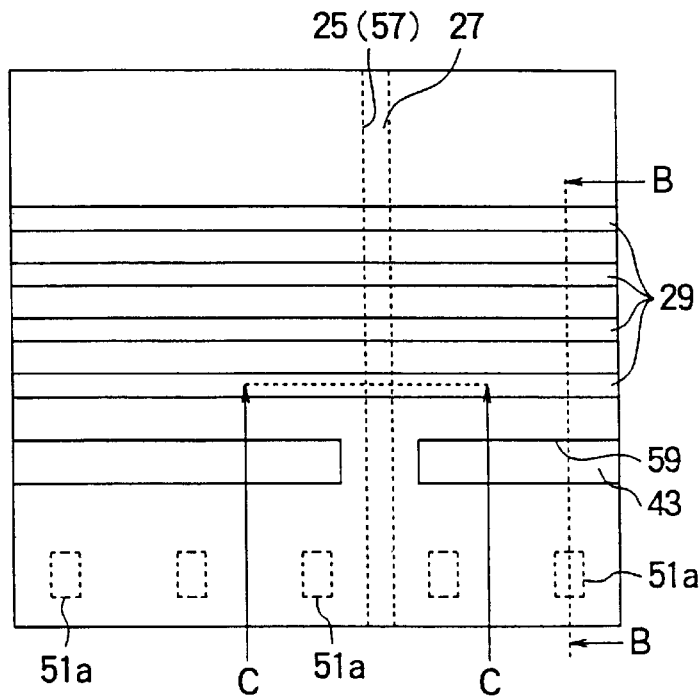
FIG. 11A is a plan view illustrating a further stage in this fabrication process.
Figure 11B:
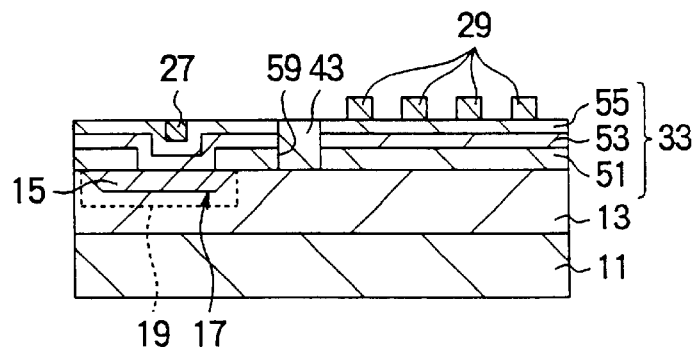
FIGS. 11B and 11C are sectional views through lines B—B and C—C, respectively, in FIG. 11A.
Figure 11C:
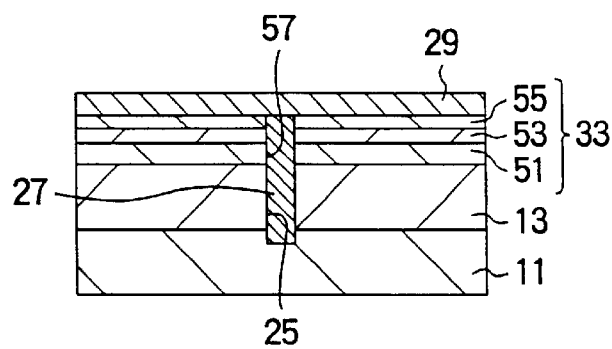

Next, a multi-layer of aluminum and nickel (an aluminum layer covered by a nickel layer) is deposited on the wafer surface and patterned by photolithography and etching to form the shared lines 29 on the first inter-layer insulating film 33. FIGS. 11A, 11B, and 11C illustrate the resulting state. Four shared lines 29 are formed, each extending the entire length of the array.

Figure 12A:
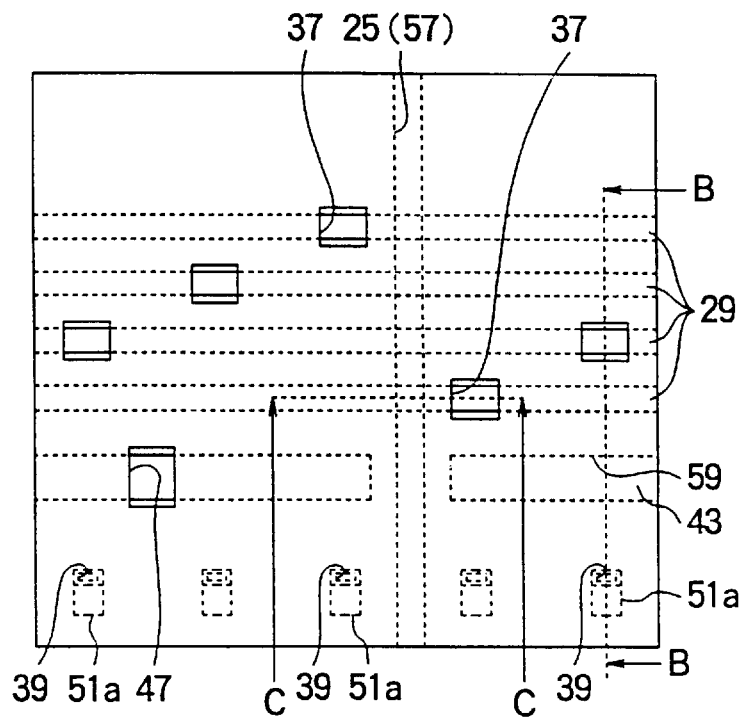
FIG. 12A is a plan view illustrating a further stage in this fabrication process.
Figure 12B:
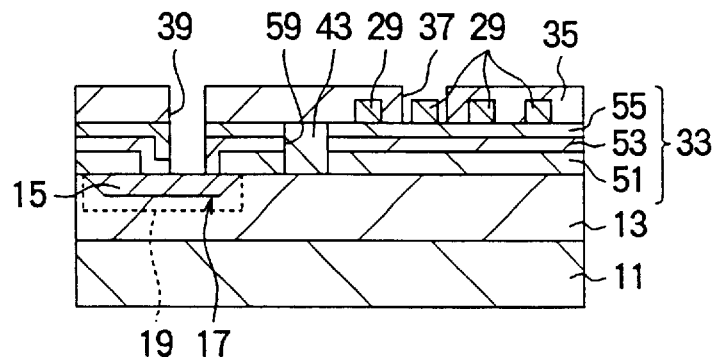
FIGS. 12B and 12C are sectional views through lines B—B and C—C, respectively, in FIG. 12A.
Figure 12C:
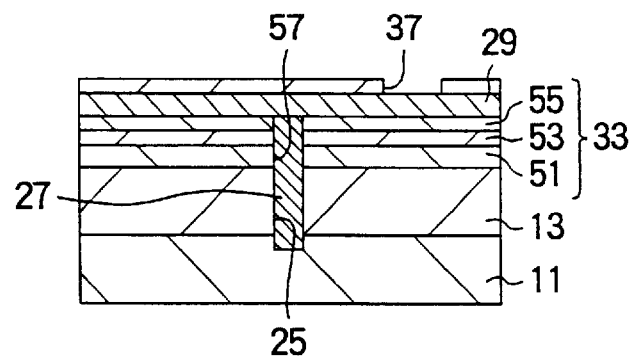

Silicon nitride (SiN) is now deposited by the plasma CVD method to a thickness of 1000 Å, covering the first inter-layer insulating film 33, the block electrodes 43, and the shared lines 29, to create the second inter-layer insulating film 35. Via holes 37 extending to the shared lines 29 and via holes 47 extending to the block electrodes 43 are formed in the second inter-layer insulating film 35 by photolithography and etching; then openings 39 extending through the first and second inter-layer insulating films 33 and 35 to the surfaces of the diffusion areas are formed by a separate photolithography-and-etching step. FIGS. 12A, 12B, and 12C illustrate the state after the formation of the via holes 37 and 47 and openings 39. The reason for forming the openings 39 in a separate step is that etching damage might occur in the first inter-layer insulating film 33 below the shared lines 29 if the via holes 37 and openings 39 were to be formed in a single step.

Figure 13A:
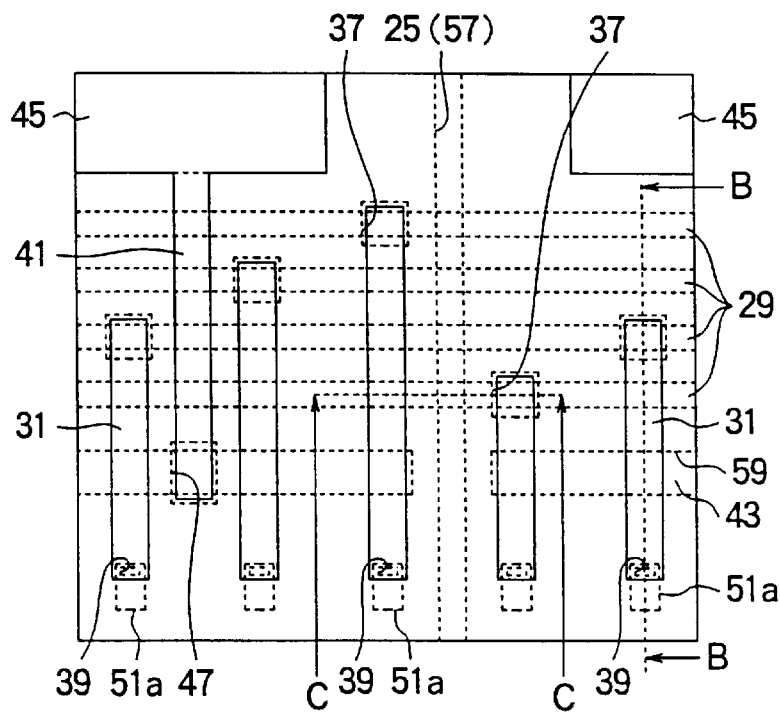
FIG. 13A is a plan view illustrating a further stage in this fabrication process.
Figure 13B:
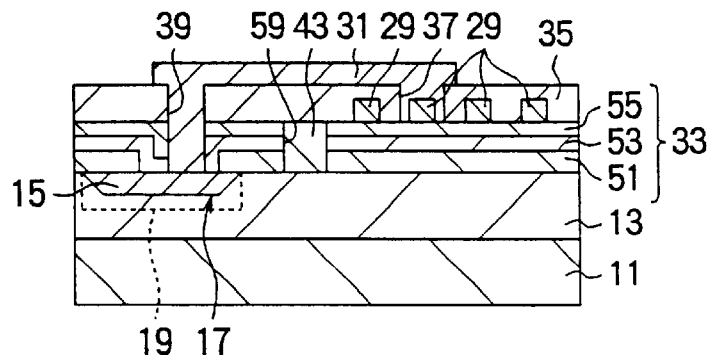
FIGS. 13B and 13C are sectional views through lines B—B and C—C, respectively, in FIG. 13A.
Figure 13C:
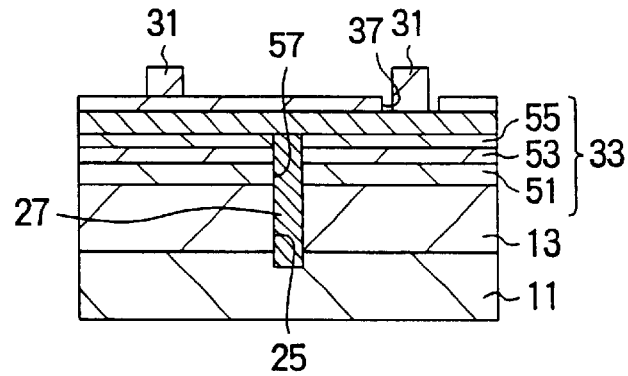

A second layer of aluminum is now deposited on the wafer, covering the second inter-layer insulating film 35 and filling the via holes 37 and 47 and openings 39. This layer of aluminum is patterned by photolithography and etching to form the block bonding pads 45, the block lines 41 that interconnect the block bonding pads 45 and block electrodes 43, and the individual lines 31 that interconnect the shared lines 29 and diffusion areas 15. FIGS. 13A, 13B, and 13C illustrate the state after the formation of these interconnecting lines and pads. The block lines 41 are preferably routed between a pair of individual lines 31 in the middle of each block, in the present case between the second and third individual lines 31 in each block, as illustrated in FIG. 13A. However, the block lines 41 may be routed between any individual lines 31.

Although not illustrated in the drawings, the bonding pads for the shared lines 29 are formed at the same time as the block bonding pads 45 for the block lines 41. These shared-line bonding pads can be formed in spaces between the block bonding pads 45. It suffices to form one bonding pad for each shared line 29, coupled to the shared line 29 by an extension of one of the individual lines 31, or by a separate interconnecting line. Both the shared-line bonding pads and the block bonding pads 45 are disposed on the same side of the row of light-emitting diodes 19, so both sets of bonding pads can be coupled by wire bonding to a single driver IC on one side of the light-emitting-diode array without having any bonding wires pass over the light-emitting diodes 19.

The shared-line bonding pads can also be disposed between the block bonding pads 45, as illustrated in the sixth embodiment.

As the above description shows, the isolation channels 25 can be formed by standard photolithography and etching technology, and can be filled with an insulating material 27 by a simple polyimide coating and curing process. Excellent electrical isolation of the blocks 23 can therefore be achieved at a low cost.

Solid-phase diffusion of zinc has the advantage of permitting the formation of shallow diffusion areas 15. Consequently, the n-type upper layer 13 can be thin, so the isolation channels 25 do not have to be very deep. This simplifies the filling of the isolation channels 25 with an insulating material 27.

Formation of the diffusion areas 15 before formation of the isolation channels 25 has the advantage that the diffusion process is not affected by the presence of the isolation channels. A uniform set of light-emitting diodes can therefore be obtained.

The fabrication method described above can be varied in a number of ways. For example, the n-type semiconducting upper layer 13 can be formed more inexpensively by diffusing an n-type impurity such as silicon (Si) or tin (Sn) into the surface of a semi-insulating GaAs wafer, instead of by epitaxial growth. This can be done by depositing an oxide film containing an n-type impurity such as silicon or tin on the semi-insulating GaAs wafer, depositing an anneal-cap film on the oxide film, then annealing the wafer at 800° C. for four hours, for example. The oxide film can be deposited by the sputtering method or any other suitable method, and can have a thickness of, for example, 1000§. After this n-type diffusion, the oxide film and anneal-cap film should be removed before the p-type diffusion is performed to create the diffusion areas 15.

Second Embodiment

The second embodiment adopts a layout generally similar to that shown in FIG. 3, in which the shared lines 29 and block electrodes 43 are on opposite sides of the array of light-emitting diodes 19, but reverses the aluminum metalization sequence. The following description will concentrate on the points that differ from the first embodiment.

The structure of the second embodiment is illustrated in FIGS. 14A, 14B, 14C, and 14D. The semi-insulating GaAs lower layer 11, the n-type epitaxial GaAs upper layer 13, the p-type diffusion areas 15, the isolation channels 25 filled with a polyimide insulating material 27, and the block electrodes 43 are identical to the corresponding elements in the first embodiment. The first inter-layer insulating film 33, comprising the diffusion mask 51, diffusion-source film 53, and anneal-cap film 55, is also the same as in the first embodiment, except for the locations of openings and via holes. The second inter-layer insulating film 35 is made of polyimide.

Figure 14A:
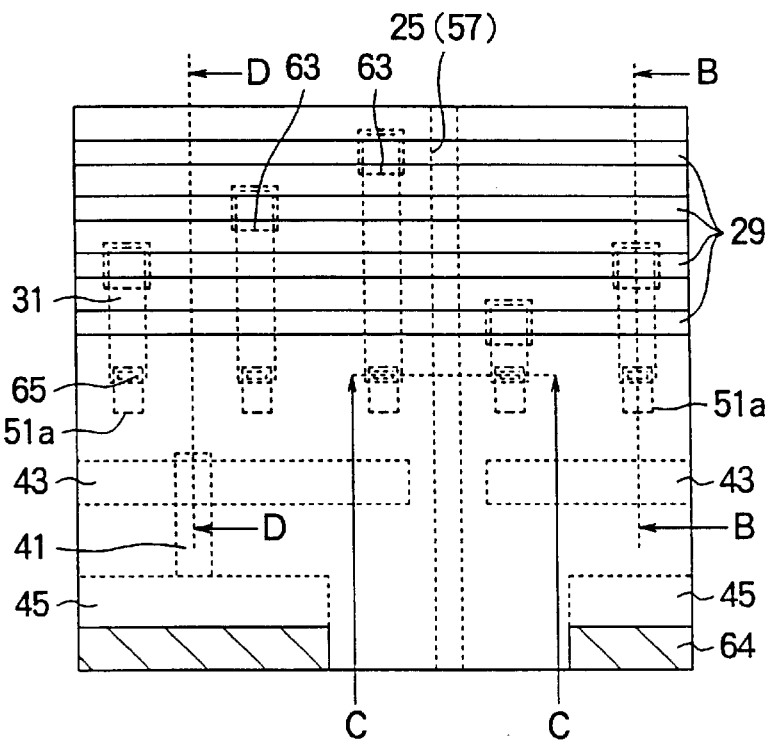
FIG. 14A is a plan view of a second embodiment of the invented light-emitting-diode array.
Figure 14B:
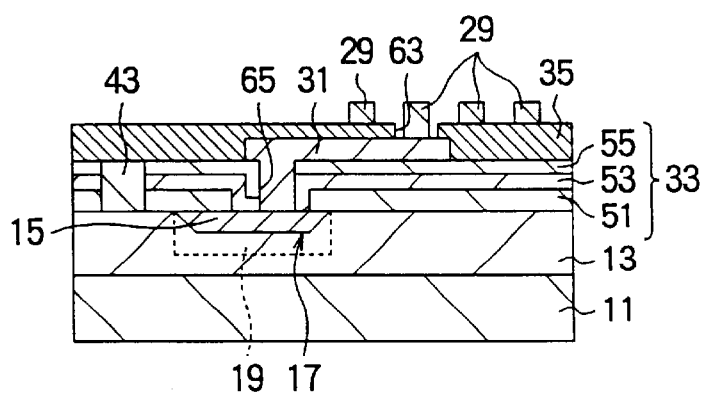
FIGS. 14B, 14C, and 14D are sectional views through lines B—B, C—C, and D—D, respectively, in FIG. 14A.
Figure 14C:
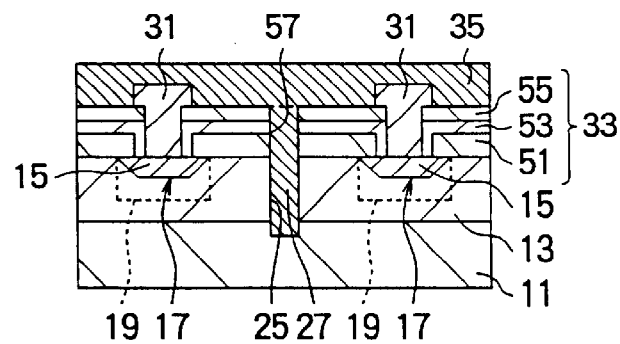
Figure 14D:
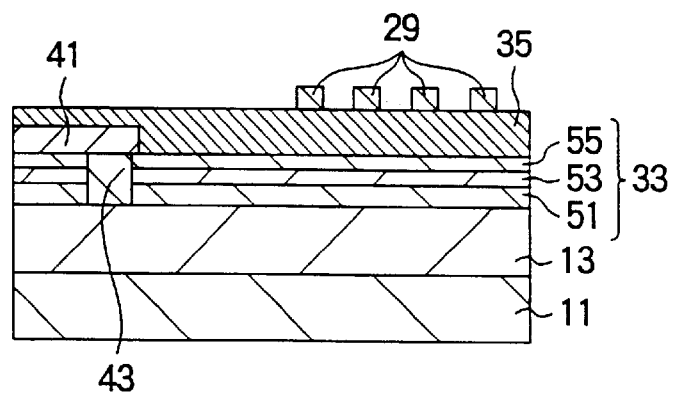

As shown in FIGS. 14B and 14D, the individual lines 31 and block lines 41 are formed between the first and second inter-layer insulating films 33 and 35. The block bonding pads 45 coupled to the block lines 41 are also formed between the first and second inter-layer insulating films 33 and 35. The shared lines 29 are formed on the second inter-layer insulating film 35.

The shared lines 29, individual lines 31, block lines 41, and block bonding pads 45 are all formed by patterning a single layer of aluminum. The surface of this aluminum layer is plated with nickel to prevent oxidation and assure good electrical contact between the individual lines 31 and shared lines 29.

The second inter-layer insulating film 35 has via holes 63 through which the shared lines 29 are connected to the individual lines 31. The second inter-layer insulating film 35 also has windows 64, indicated by hatching in FIG. 14A, that expose most of the area of the block bonding pads 45. The first inter-layer insulating film 33 has openings 57 for formation of the isolation channels 25, as in the first embodiment, and openings 65 through which the individual lines 31 make contact with the surfaces of the diffusion areas 15.

Although not illustrated in the drawings, bonding pads for the shared lines 29 are also formed between the first and second inter-layer insulating films 33 and 35. These shared-line bonding pads are disposed on the opposite side of the row of light-emitting diodes 19 from the block bonding pads 45, and are coupled to the shared lines 29 by interconnecting lines (not visible) similar to the individual lines 31. Windows and via holes (not visible) are opened in the second inter-layer insulating film 35 to expose these shared-line bonding pads and permit contact between their interconnecting lines and the shared lines.

Referring again to FIG. 14B, when a light-emitting diode 19 is turned on, current flows from the corresponding individual line 31 through the diffusion area 15, pn junction 17, and n-type upper layer 13 to the block electrode 43. Compared with the first embodiment, since the individual line 31 contacts the diffusion area 15 on the side farthest from the block electrode 43 in the second embodiment, more of the current flow is channeled through the part of the pn junction 17 that is not covered by the individual line 31. Less light is therefore blocked by the individual line 31, and more light is emitted.

Next, a fabrication method for the second embodiment will be described with reference to FIGS. 15A to 19C.

Figure 15A:
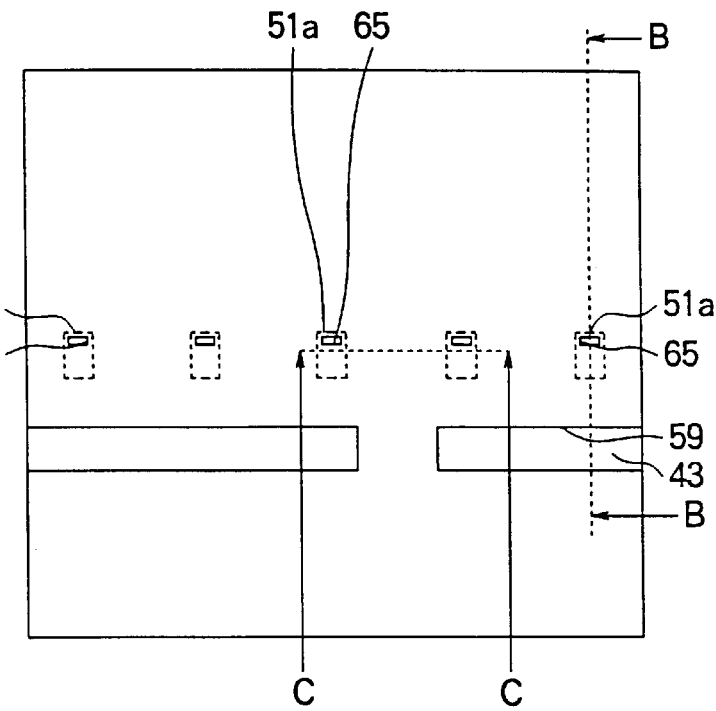
FIG. 15A is a plan view illustrating a stage in the fabrication process of the second embodiment.
Figure 15B:
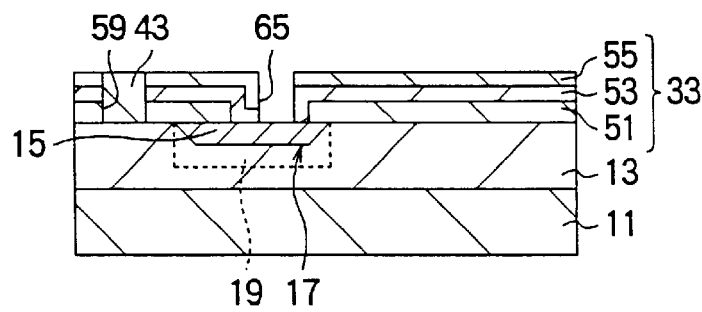
FIGS. 15B and 15C are sectional views through lines B—B and C—C, respectively, in FIG. 15A.
Figure 15C:
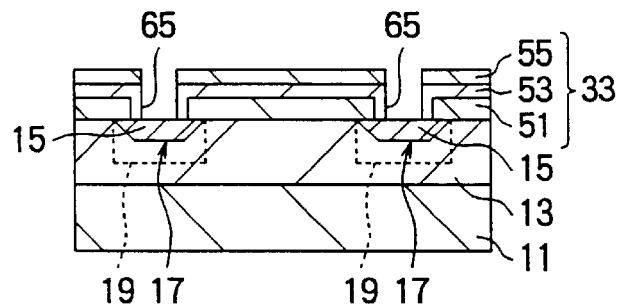

The fabrication steps through the formation of the diffusion areas 15 are the same as in the first embodiment, and leave a first inter-layer insulating film 33 comprising a diffusion mask 51, diffusion-source film 53, and anneal-cap film 55. Referring to FIGS. 15A, 15B, and 15C, openings 59 and 65 are created in the first inter-layer insulating film 33 by photolithography and etching, the openings 59 being positioned above the n-type upper layer 13 in the desired locations of the block electrodes 43, while the openings 65 are positioned above the p-type diffusion areas 15. Then a lift-off mask is formed on the first inter-layer insulating film 33, covering the latter openings 65 and exposing the former openings 59. A layer of gold alloy is deposited by evaporation on this mask, filling the openings 59; then the mask and gold alloy layer are lifted off, leaving the block electrodes 43 in the openings 59, as illustrated.

Figure 16A:
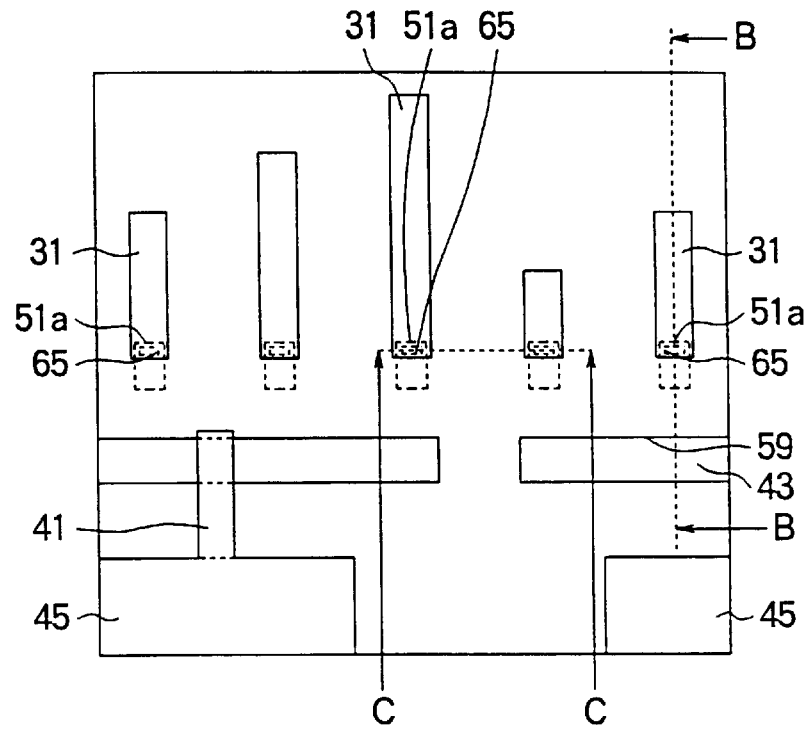
FIG. 16A is a plan view illustrating a further stage in this fabrication process.
Figure 16B:
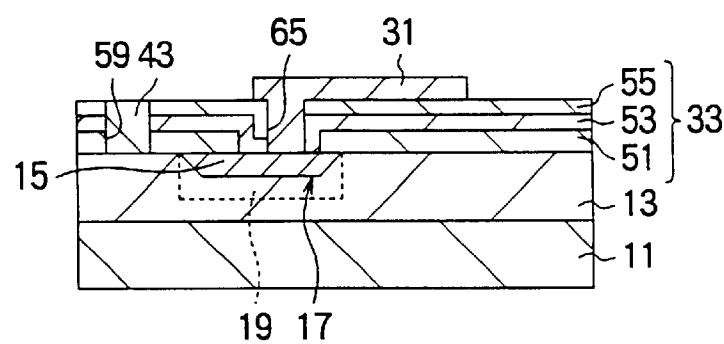
FIGS. 16B and 16C are sectional views through lines B—B and C—C, respectively, in FIG. 16A.
Figure 16C:
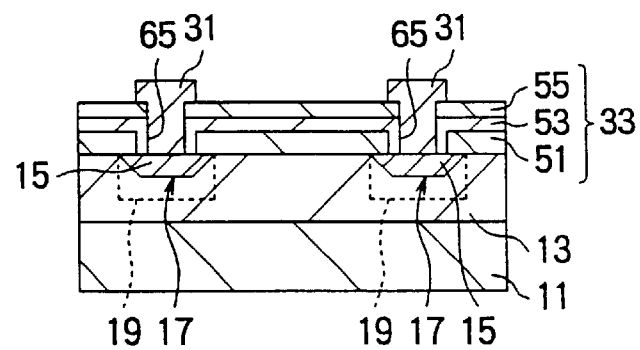

Next, a layer of aluminum is deposited and patterned by photolithography and etching to form the individual lines 31, block lines 41, and block bonding pads 45, as illustrated in FIGS. 16A, 16B, and 16C. Although not illustrated, the shared-line bonding pads and the interconnecting lines that will couple these bonding pads to the shared lines 29 are also formed in this step.

Figure 17A:
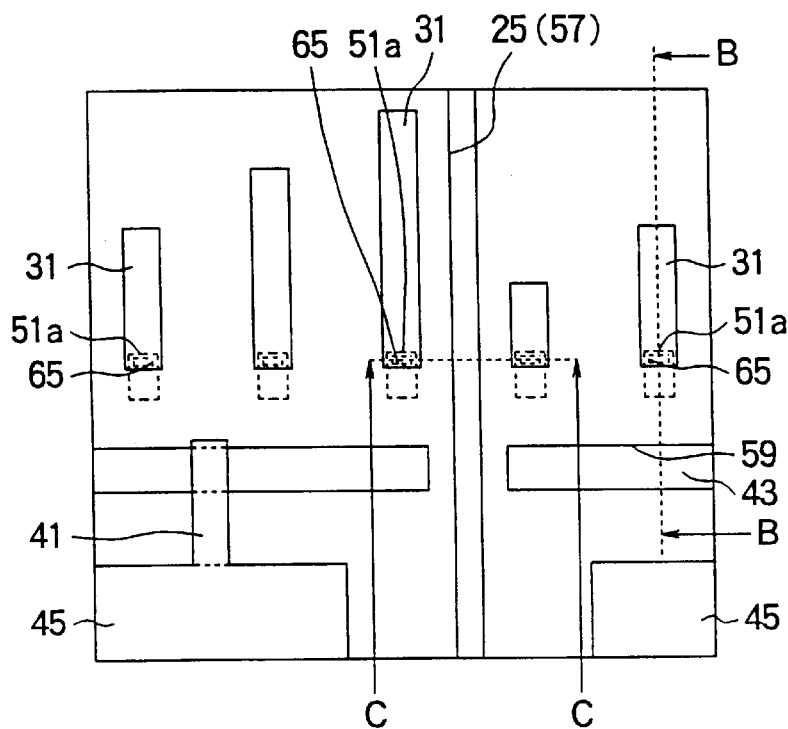
FIG. 17A is a plan view illustrating a further stage in this fabrication process.
Figure 17B:
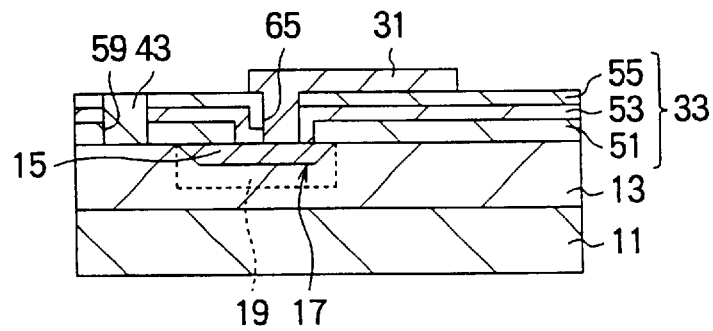
FIGS. 17B and 17C are sectional views through lines B—B and C—C, respectively, in FIG. 17A.
Figure 17C:
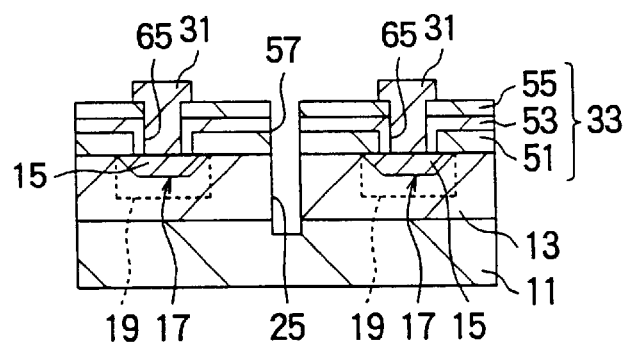
Figure 18A:
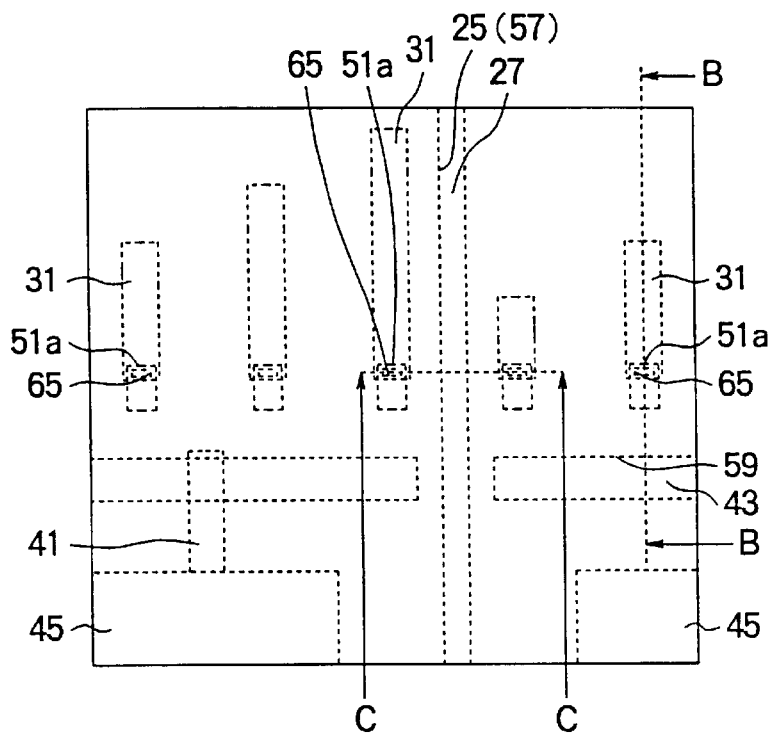
FIG. 18A is a plan view illustrating a further stage in this fabrication process.
Figure 18B:
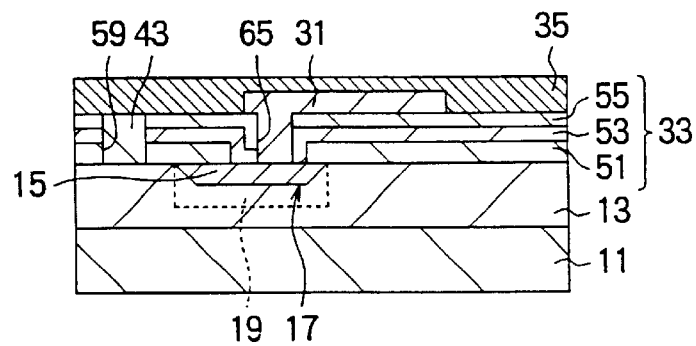
FIGS. 18B and 18C are sectional views through lines B—B and C—C, respectively, in FIG. 18A.
Figure 18C:
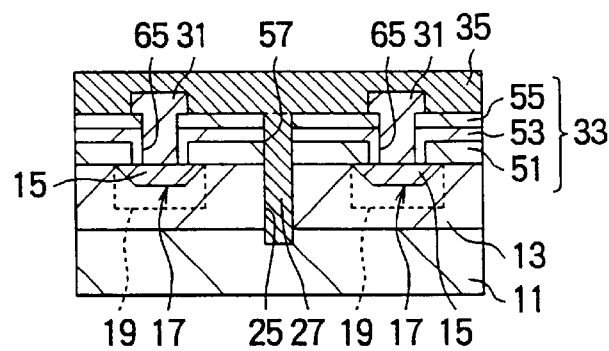
Figure 19A:
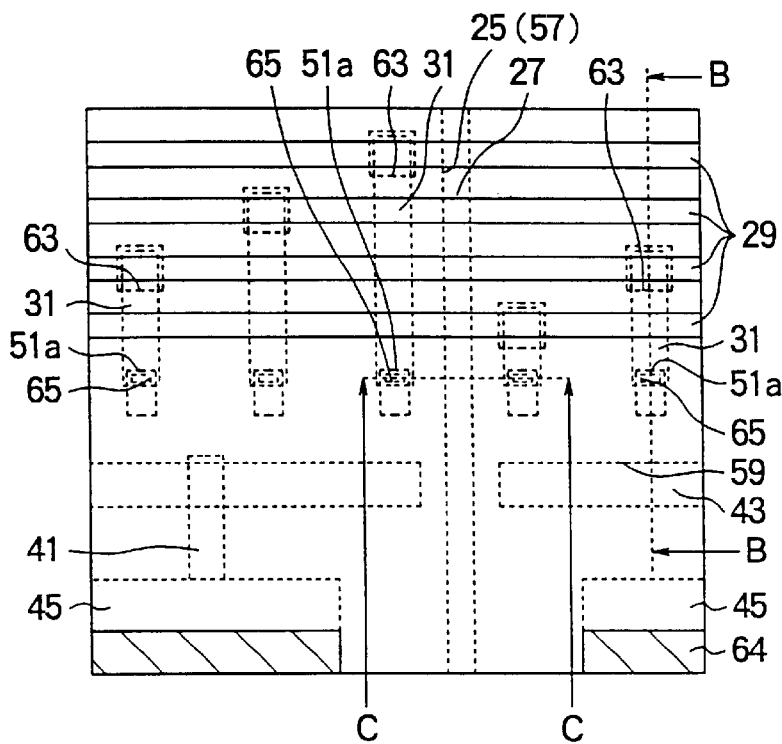
FIG. 19A is a plan view illustrating a further stage in this fabrication process.
Figure 19B:
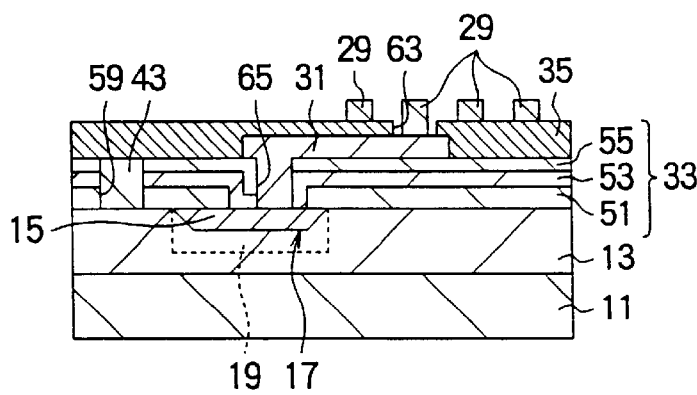
FIGS. 19B and 19C are sectional views through lines B—B and C—C, respectively, in FIG. 19A.
Figure 19C:
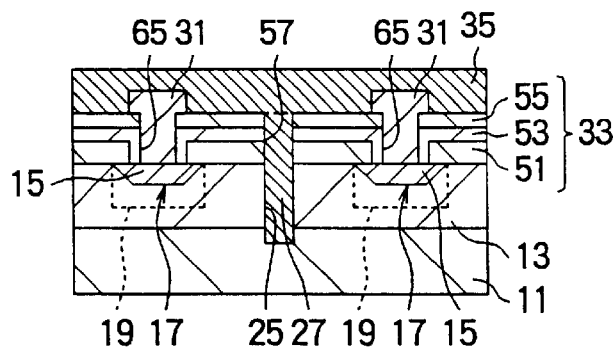

Next, the wafer is coated with a photoresist, which is patterned by photolithography, and a dry etching process is carried out, using a mixture of $BCl_3$ and $Cl_2$ as the etchant gas, to form openings 57 in the first inter-layer insulating film 33 and isolation channels 25 in the upper layer 13 of the substrate, as illustrated in FIGS. 17A, 17B, and 17C. The etching conditions are controlled to give the isolation channels 25 a rectangular cross section with, for example, a depth of 6 $\mu$m and a width of 5 $\mu$m, as in the first embodiment. The windows in the photoresist that define the locations of the openings 57 and isolation channels 25 should be narrower than 5 $\mu$m, to allow for lateral etching. The photoresist is removed after the etching is completed.

Next, the isolation channels 25 are filled with an insulating material 27 and the second inter-layer insulating film 35 is formed. The insulating material 27 and second inter-layer insulating film 35 both comprise polyimide, permitting both to be formed in a single step. First, the wafer is coated with polyimide resin, the coating being thick enough both to fill the isolation channels 25 and to provide sufficient inter-layer insulating effect. The coating is then treated by baking, leaving the state illustrated in FIGS. 18A, 18B, and 18C. Although separate reference numerals are assigned to the insulating material 27 and the second inter-layer insulating film 35, both are part of the same polyimide coating. The second inter-layer insulating film 35 has a flat upper surface and a thickness of, for example, 1000 Å. provide sufficient inter-layer insulating effect. The coating is then treated by baking, leaving the state illustrated in FIGS. 18A, 18B, and 18C. Although separate reference numerals are assigned to the insulating material 27 and the second inter-layer insulating film 35, both are part of the same polyimide coating. The second inter-layer insulating film 35 has a flat upper surface and a thickness of, for example, 1000 Å.

Next, via holes 63 are formed by photolithography and etching, extending through the second inter-layer insulating film 35 to the individual lines 31, and windows 64 are opened in the second inter-layer insulating film 35 over the block bonding pads 45, after which the polyimide coating is cured. A second layer of aluminum is then deposited and patterned by photolithography and etching to form the shared lines 29, leaving the state shown in FIGS. 19A, 19B, and 19C. This second layer of aluminum may also thicken the block bonding pads 45. Alternatively, the shared lines 29 can be formed by the lift-off method.

The above-described fabrication method for the second embodiment has the advantage of forming both the insulating material 27 in the isolation channels 25 and the second inter-layer insulating film 35 in a single step, and the further advantage that the openings 57 in the first inter-layer insulating film 33 are self-aligned with the isolation channels 25. Fewer separate photolithography steps are required than in the first embodiment.

Another advantage is that the patterning of the individual lines 31, block lines 41, and block bonding pads 45 is not affected by the presence of isolation channels 25, since the isolation channels 25 are not formed until later.

Third Embodiment

The third embodiment differs from the first embodiment in regard to the isolation channels 25. In the first embodiment, the isolation channels 25 had a rectangular cross section and were filled with a polyimide insulating material. In the third embodiment, the isolation channels have a trapezoidal cross section and are covered by the first inter-layer insulating film 33.

Aside from these differences, the structure of the third embodiment is the same as the structure of the first embodiment. The structure of the third embodiment is illustrated in FIGS. 20A, 20B, 20C, 20D, and 20E.

Figure 20A:
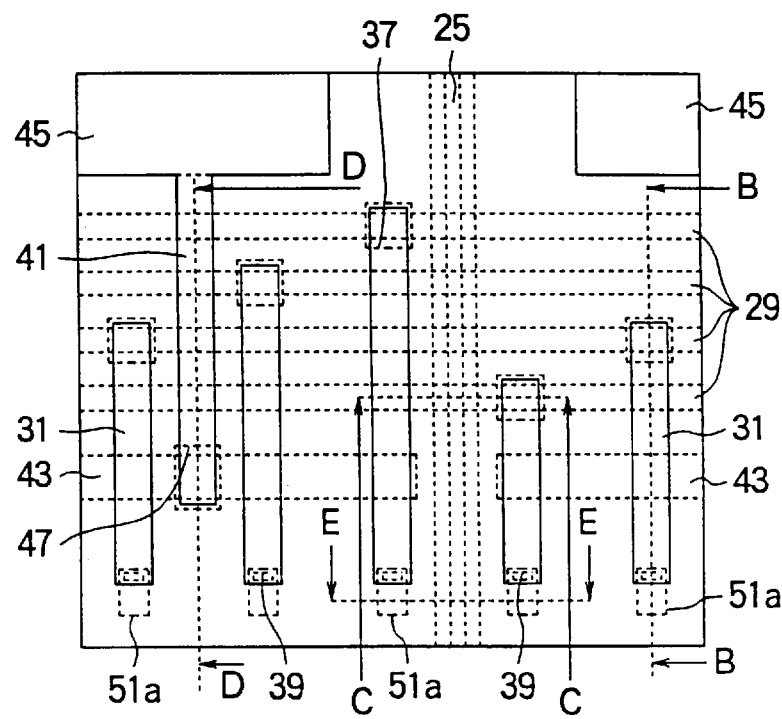
FIG. 20A is a plan view of a third embodiment of the invented light-emitting-diode array.

Referring to FIG. 20A, the isolation channels 25 are widest at the top and narrowest at the bottom, as indicated by the double dotted lines. FIG. 20C, which is a sectional view through line C—C, shows the trapezoidal shape of the isolation channels 25. The depth of the isolation channels 25 is, for example, 5 $\mu$m. The isolation channels 25 are coated by the first inter-layer insulating film 33, comprising the diffusion mask 51, the diffusion-source film 53, and the anneal-cap film 55, which have the same composition as in the first embodiment. The surface of the isolation channels 25 is not planarized as it was in the first embodiment, so the shared lines 29 follow the contours of the isolation channels 25. Since these contours are trapezoidal rather than rectangular, the contours are comparatively gentle, and the shared lines 29 can be formed without risk of electrical discontinuities.

The width of the tops of the isolation channels 25 is constrained by the array density and the width of the diffusion areas 15 at the top of the upper layer 13. Referring to FIG. 20E, if the diode pitch (p) is approximately 21 $\mu$m, the width (a) of the diffusion windows (not shown) is 3 $\mu$m, the lateral diffusion distance (b) of the zinc impurity is 1.5 $\mu$m, and the width (c) of the diffusion areas 15 at the top of the upper layer 13 equal to is 6 $\mu$m, then the isolation channels 25 can be formed so that their sides slope at an angle of 51° with respect to the wafer surface, and their bottom width (d1) is 3 $\mu$m, making their top width (d2) approximately 11 $\mu$m, provided the depth of the isolation channels 25 is 5 $\mu$m; This leaves a distance (e) of approximately 2 $\mu$m between the tops of the diffusion areas 15 and the tops of the isolation channels 25.

Incidentally, the steepness of the sides of the isolation channels 25 is greatly exaggerated, for clarity, in the drawings.

Figure 20B:
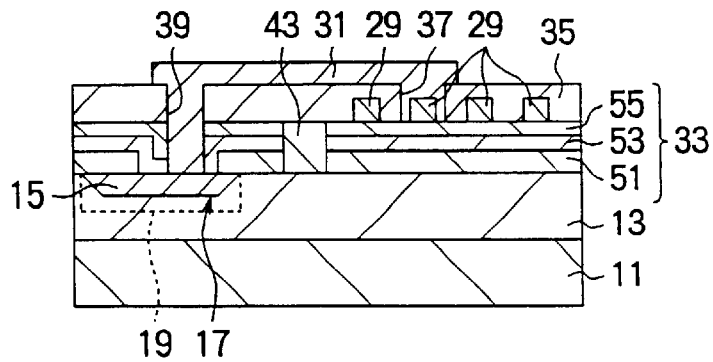
FIGS. 20B, 20C, 20D, and 20E are sectional views through lines B—B, C—C, D—D, and E—E, respectively, in FIG. 20A, with FIG. 20E showing diffusion areas and an isolation channel, while not showing an insulating film.
Figure 20C:
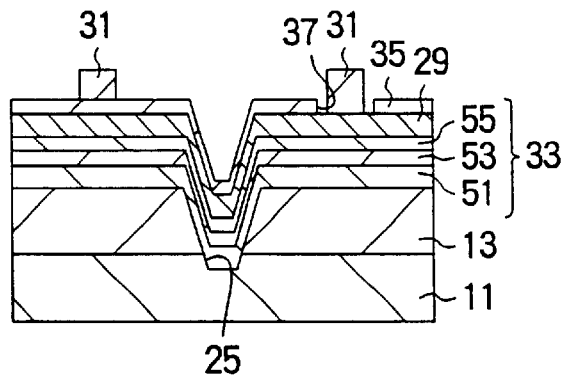
Figure 20D:
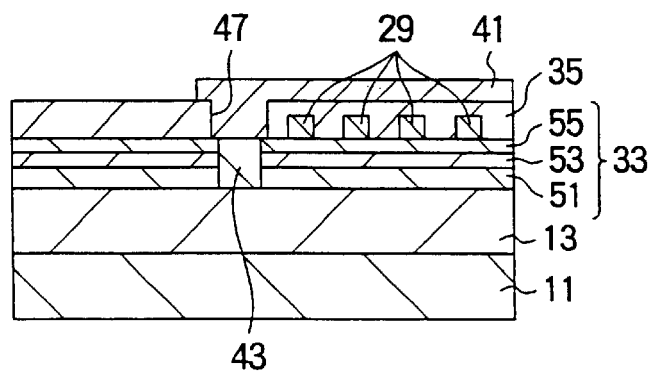
Figure 20E:
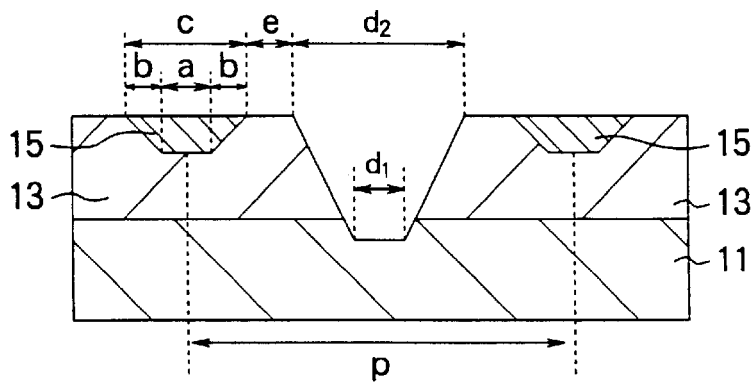

Sectional views through lines B—B and D—D, shown in FIGS. 20B and 20D, are the same as in the first embodiment.

Next, a fabrication method for the third embodiment will be described with reference to FIGS. 21A to 24C.

Figure 21A:
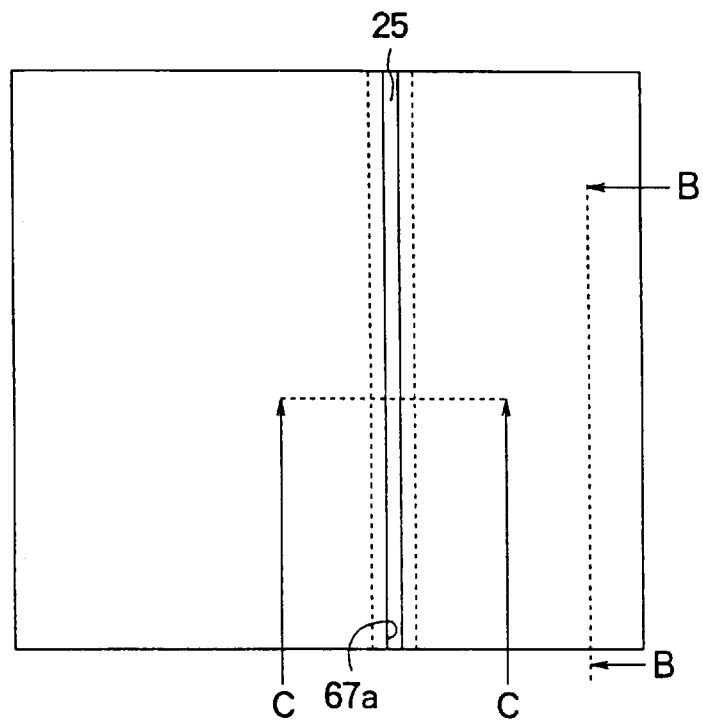
FIG. 21A is a plan view illustrating a stage in the fabrication process of the third embodiment.
Figure 21B:
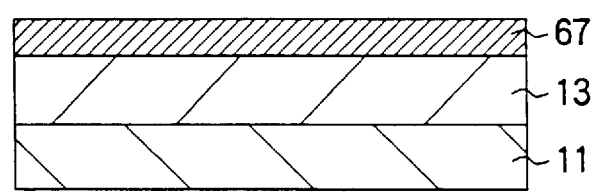
FIGS. 21B and 21C are sectional views through lines B—B and C—C, respectively, in FIG. 21A.
Figure 21C:
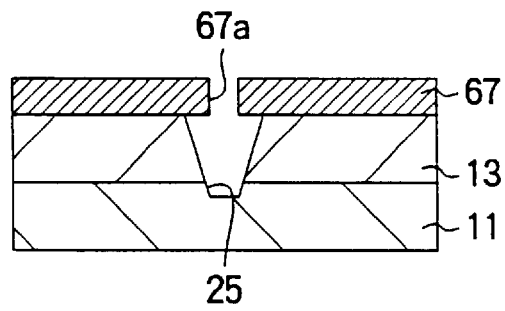

In this embodiment, the isolation channels 25 are formed before the diffusion areas 15. Referring to FIGS. 21A, 21B, and 21C, after an n-type GaAs upper layer 13 has been created by epitaxial growth on a semi-insulating GaAs wafer, which forms the lower layer 11, the wafer is coated with a negative resist 67, in which groove-like windows 67a are formed by photolithography at the desired locations of the isolation channels 25. The isolation channels 25 are then created by wet etching, using this negative resist 67 as a mask. The etchant is an aqueous solution of phosphoric acid and hydrogen peroxide. The wet etching is performed under conditions that produce a trapezoidal shape with, for example, the dimensions described above, so that the isolation channels 25 are 5 μm deep, 3 μm wide at the bottom, and 11 μm wide at the top. After this wet etching step is completed, the negative resist 67 is removed.

Figure 22A:
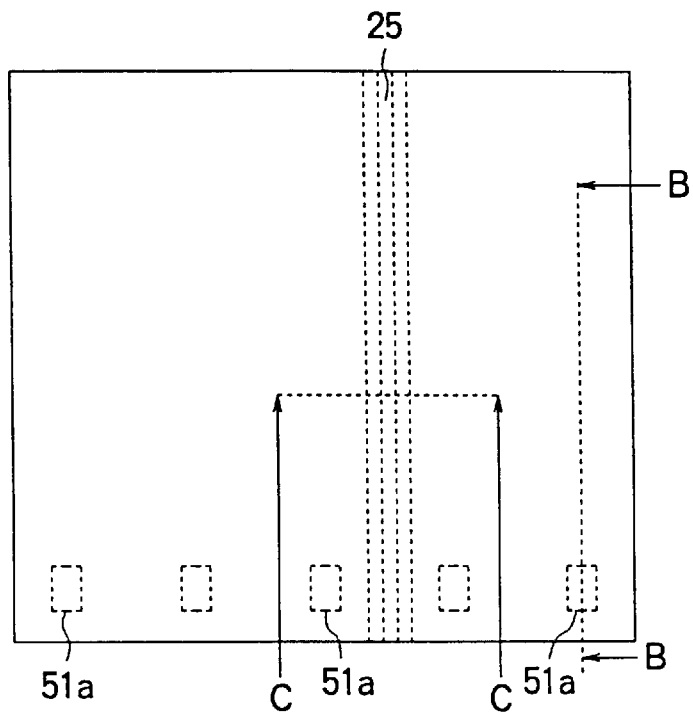
FIG. 22A is a plan view illustrating a further stage in this fabrication process.
Figure 22B:
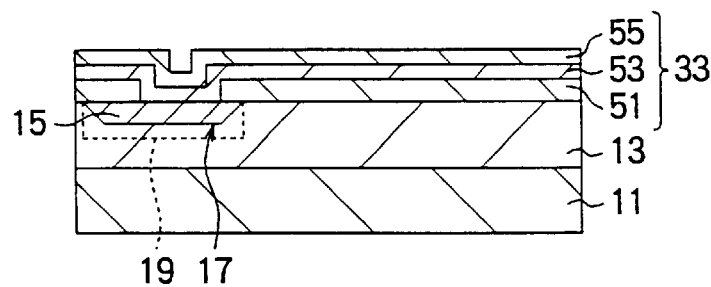
FIGS. 22B and 22C are sectional views through lines B—B and C—C, respectively, in FIG. 22A.
Figure 22C:
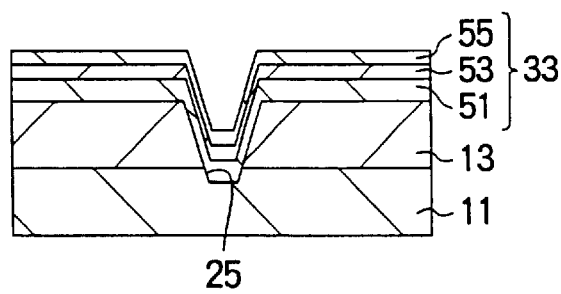

Next, referring to FIGS. 22A, 22B, and 22C, the array of light-emitting diodes 19 is formed by solid-phase diffusion of zinc, employing a diffusion mask 51, diffusion-source film 53, and anneal-cap film 55 made of the same materials as in the first embodiment, and having the same thicknesses. The diffusion mask 51, diffusion-source film 53, and anneal-cap film 55 are left in place after the diffusion step, to be used as the first inter-layer insulating film 33. This first inter-layer insulating film 33 conforms to the contours of the isolation channels 25, as shown in FIG. 22C.

Figure 23A:
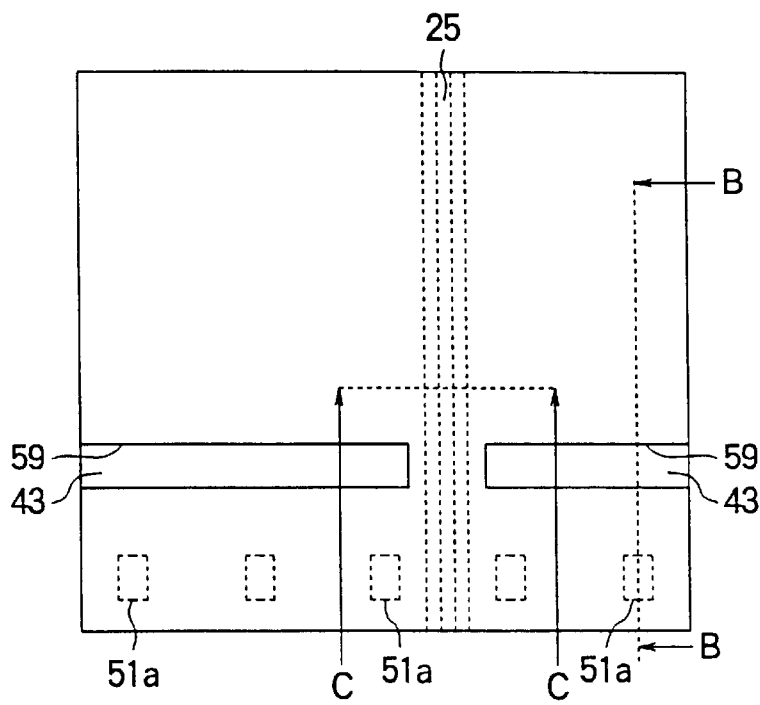
FIG. 23A is a plan view illustrating a further stage in this fabrication process.
Figure 23B:
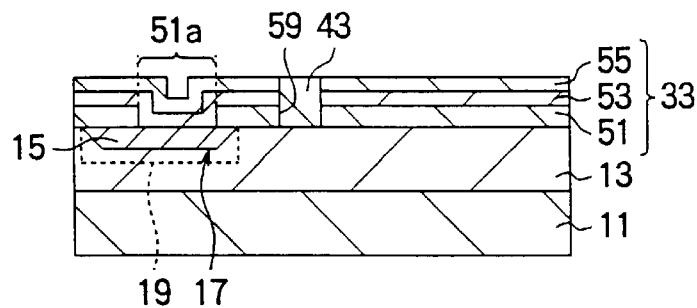
FIGS. 23B and 23C are sectional views through lines B—B and C—C, respectively, in FIG. 23A.
Figure 23C:
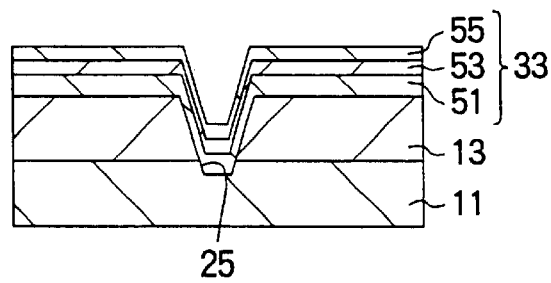

Referring to FIGS. 23A, 23B, and 23C, openings 59 for the block electrodes are created in the first inter-layer insulating film 33 by photolithography and etching, and the block electrodes 43 are formed in these openings 59 by evaporation deposition and lift-off of a gold alloy film.

Figure 24A:
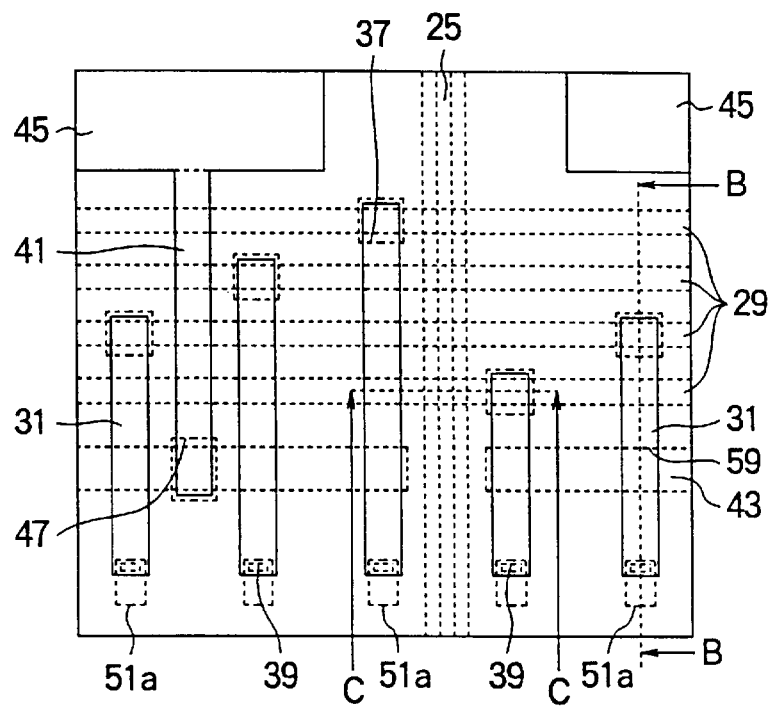
FIG. 24A is a plan view illustrating a further stage in this fabrication process.
Figure 24B:
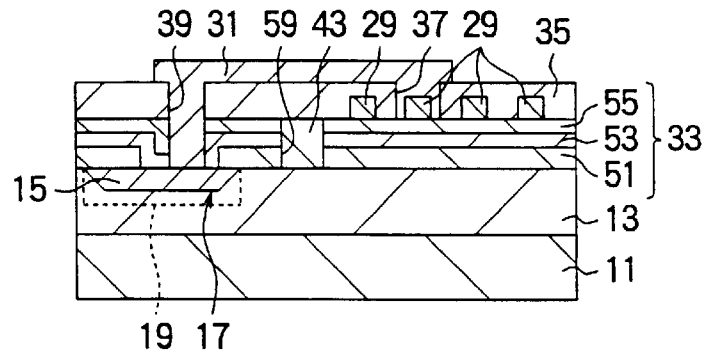
FIGS. 24B and 24C are sectional views through lines B—B and C—C, respectively, in FIG. 24A.
Figure 24C:
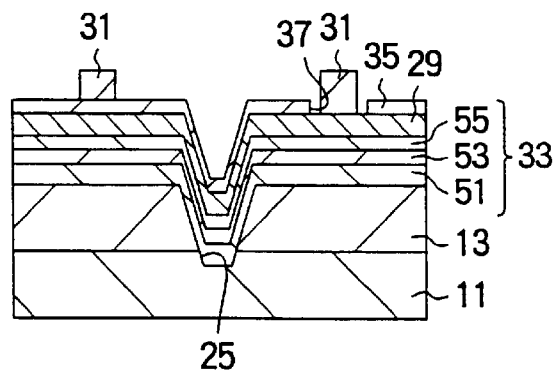

Referring to FIGS. 24A, 24B, and 24C, the shared lines 29, second inter-layer insulating film 35, via holes 37 and 47, openings 39, block lines 41, block bonding pads 45, individual lines 31, and shared-line bonding pads (not visible) are then formed as in the first embodiment.

The third embodiment has the advantage of eliminating the fabrication steps that were needed, in the preceding embodiments, to fill the isolation channels 25 with an insulating material, and planarize the wafer surface after the formation of the isolation channels.

Fourth Embodiment

The fourth embodiment gives the isolation channels 25 a trapezoidal shape as in the third embodiment. The description below will focus on the differences between the third and fourth embodiments.

Figure 25A:
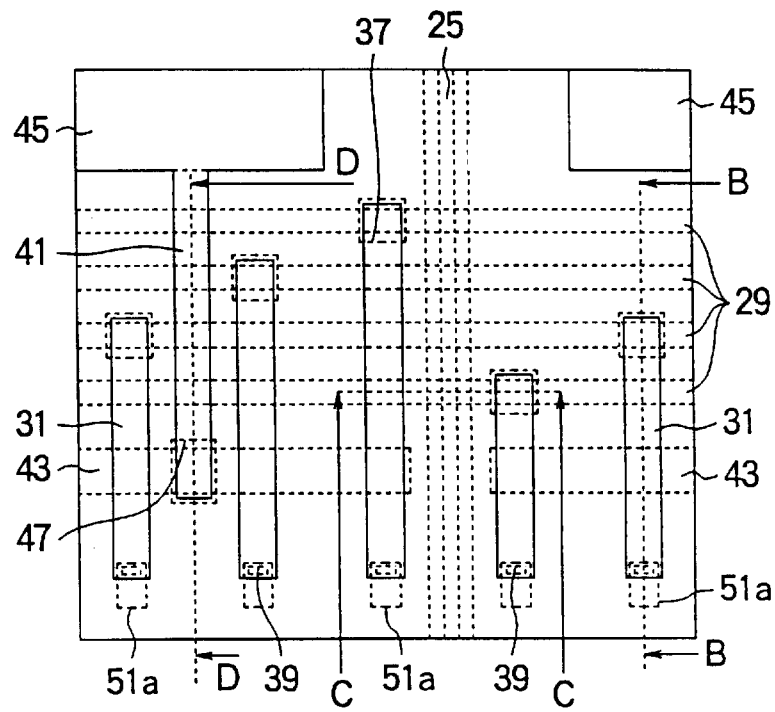
FIG. 25A is a plan view of a fourth embodiment of the invented light-emitting-diode array.
Figure 25B:
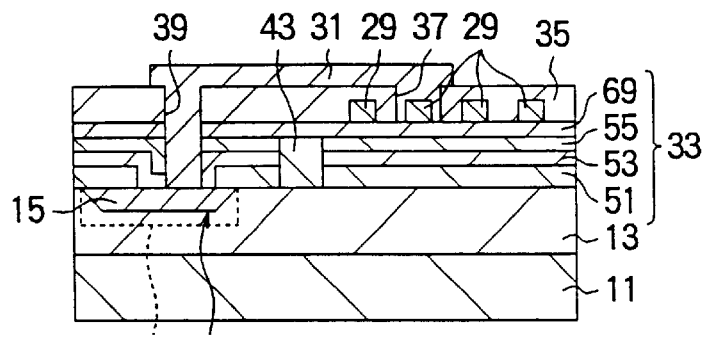
FIGS. 25B, 25C, and 25D are sectional views through lines B—B, C—C, and D—D, respectively, in FIG. 25A.

First, the structure of the fourth embodiment will be described with reference to FIGS. 25A, 25B, 25C, and 25D. Referring to FIG. 25A, the plan-view layout of component elements is the same as in the first and third embodiments. Referring to FIG. 25B, the first inter-layer insulating film 33 comprises a diffusion mask 51, a diffusion-source film 53, and an anneal-cap film 55 as in the preceding embodiments, and an additional insulating layer 69 of SiN.

Figure 25C:
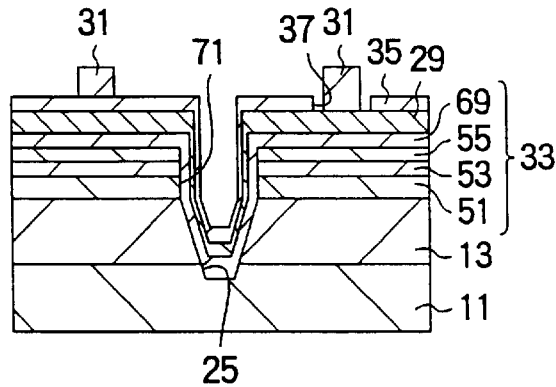

Referring to FIG. 25C, the isolation channels 25 are formed below openings in the diffusion mask 51, diffusion-source film 53, and anneal-cap film 55, so the isolation channels 25 are not coated by these parts of the first inter-layer insulating film 33. The isolation channels 25 are coated, however, by the additional insulating layer 69. This additional insulating layer 69 also coats the sidewalls 71 of the openings in the diffusion mask 51, diffusion-source film 53, and anneal-cap film 55 above the isolation channels 25.

The shared lines 29 follow the contours of these sidewalls 71 and the contours of the isolation channels 25, as does the second inter-layer insulating film 35. The thicknesses of the diffusion mask 51, diffusion-source film 53, anneal-cap film 55, and second inter-layer insulating film 35 can be the same as in the preceding embodiments. The thickness of the additional insulating layer 69 can be, for example, 1000 Å.

Figure 25D:
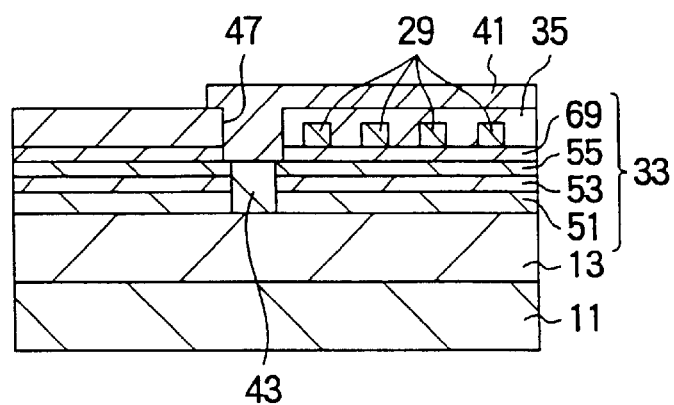

The sectional structure through line D—D in FIG. 25A, shown in FIG. 25D, is the same as in the third embodiment, except for the additional insulating layer 69.

Next, a fabrication method for the fourth embodiment will be described with reference to FIGS. 26A to 30C.

Figure 26A:
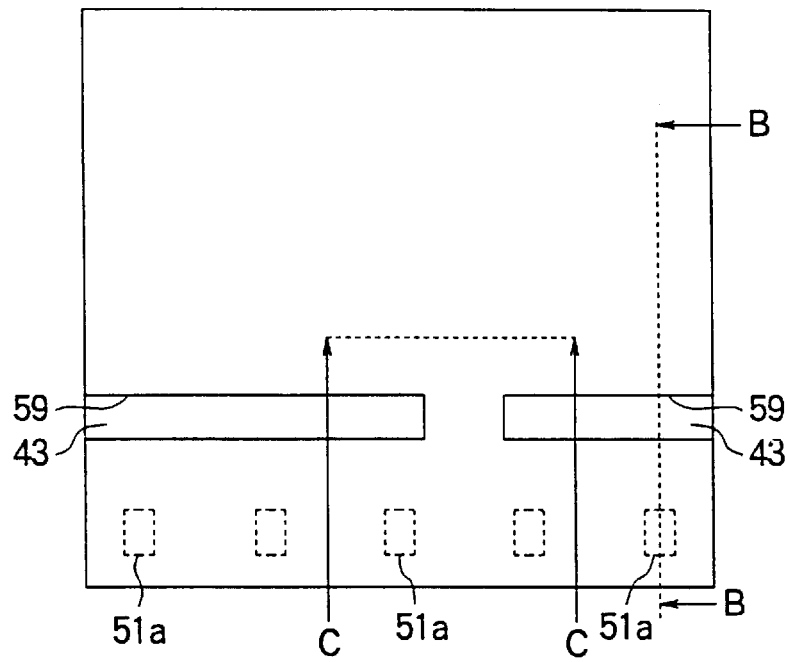
FIG. 26A is a plan view illustrating a stage in the fabrication process of the fourth embodiment.
Figure 26B:
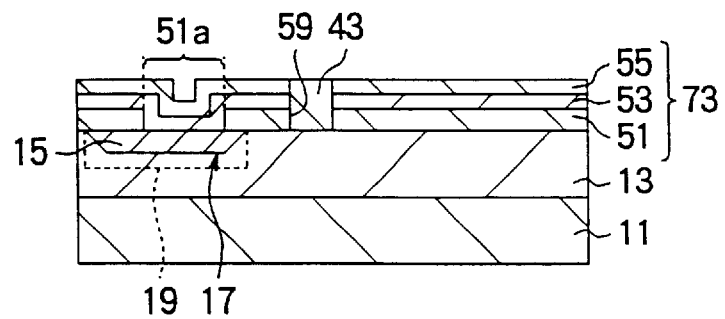
FIGS. 26B and 26C are sectional views through lines B—B and C—C, respectively, in FIG. 26A.
Figure 26C:
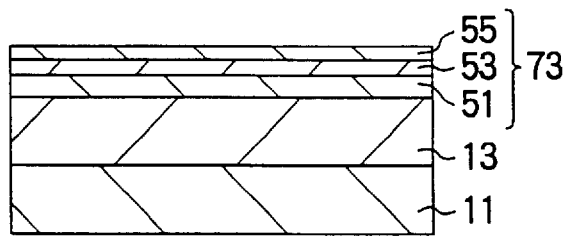

Referring to FIGS. 26A, 26B, and 26C, the diffusion areas 15 and block electrodes 43 are formed as in the first embodiment, using a multilayer film 73 comprising the diffusion mask 51, diffusion-source film 53, and anneal-cap film 55. Differing from the first embodiment, when openings 59 for the block electrodes 43 are formed in this multilayer film 73, no openings are created at the locations where the isolation channels 25 will be formed.

Figure 27A:
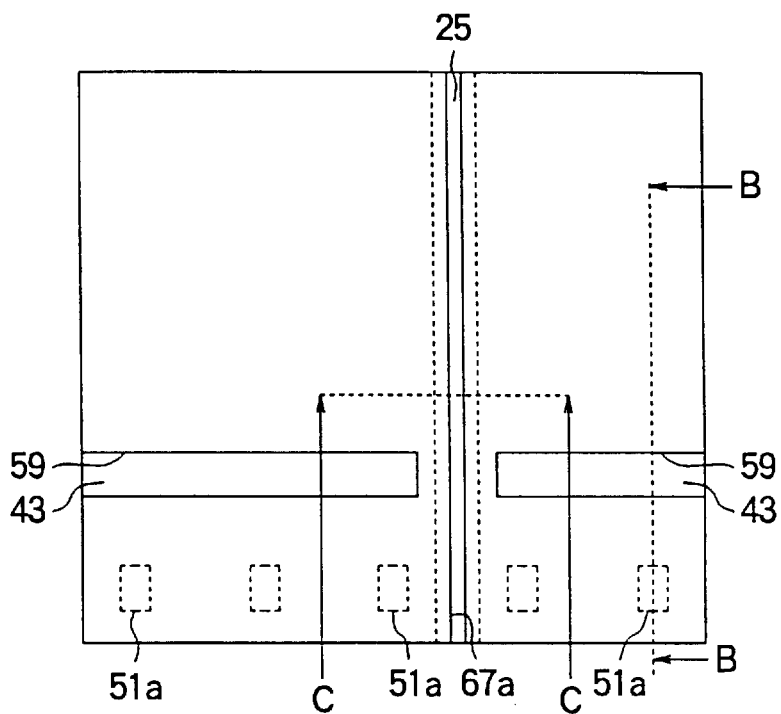
FIG. 27A is a plan view illustrating a further stage in this fabrication process.
Figure 27B:
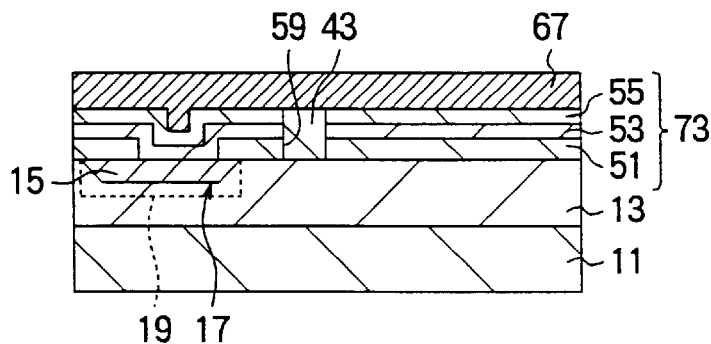
FIGS. 27B and 27C are sectional views through lines B—B and C—C, respectively, in FIG. 27A.
Figure 27C:
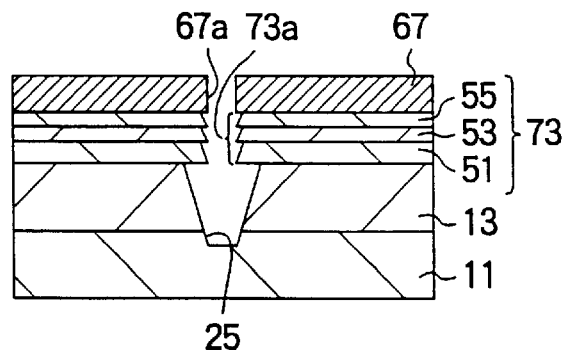
Figure 28A:
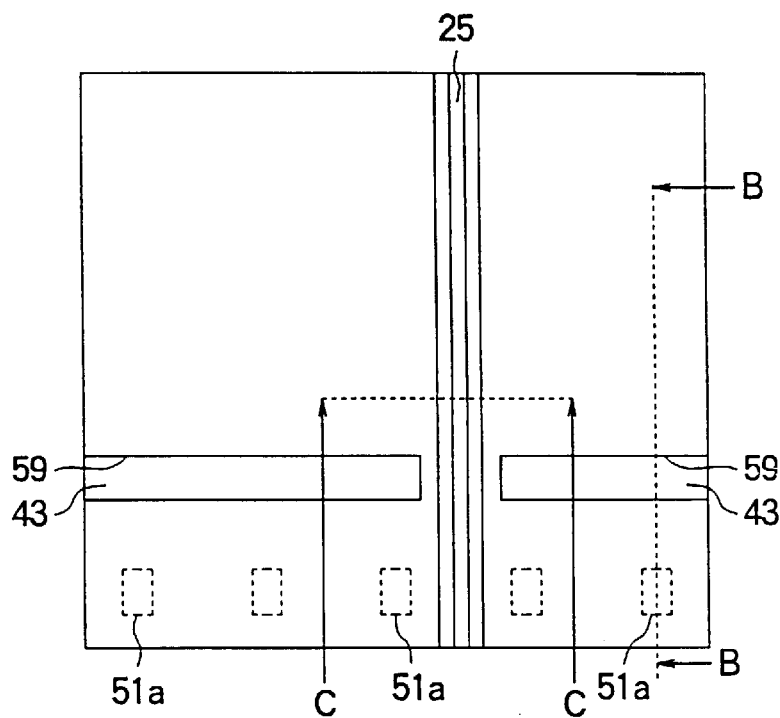
FIG. 28A is a plan view illustrating a further stage in this fabrication process.
Figure 28B:
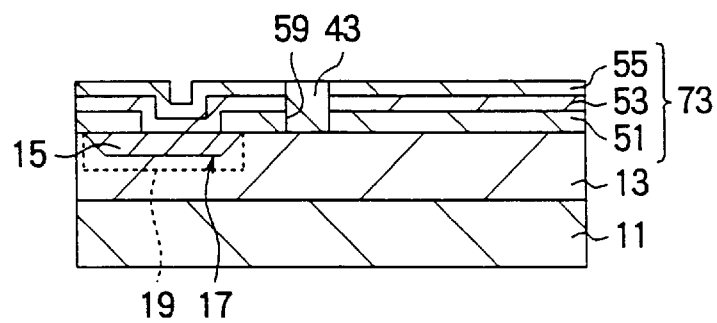
FIGS. 28B and 28C are sectional views through lines B—B and C—C, respectively, in FIG. 28A.
Figure 28C:
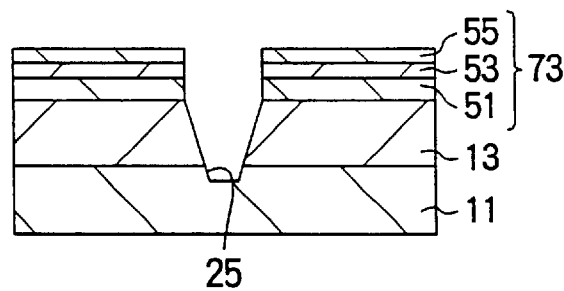

Referring to FIGS. 27A, 27B, and 27C, the wafer is coated with a negative resist 67, in which windows 67a are created by photolithography at the desired locations of the isolation channels 25. This negative resist 67 is similar to the negative resist employed in the third embodiment. The windows 67a extend through the multilayer film 73. The isolation channels 25 are then formed by wet etching, using the negative resist 67 as a mask and an aqueous solution of phosphoric acid and hydrogen peroxide as the etchant. The wet etching is performed under conditions that give the isolation channels 25 the same cross-sectional shape as in the third embodiment, e.g. a depth of 5 μm and bottom width of 3 μm, with sides sloping at an angle of substantially 51°.

The above-mentioned aqueous solution of phosphoric acid and hydrogen peroxide does not etch the multilayer film 73. Part of the multilayer film 73 is therefore left as an overhang 73a over the isolation channels 25. This overhang is removed by further wet etching, using buffered hydrofluoric acid as the etchant, followed immediately by still further wet etching with hot phosphoric acid. The negative resist 67 is then removed, leaving the state shown in FIGS. 28A, 28B, and 28C.

Figure 29A:
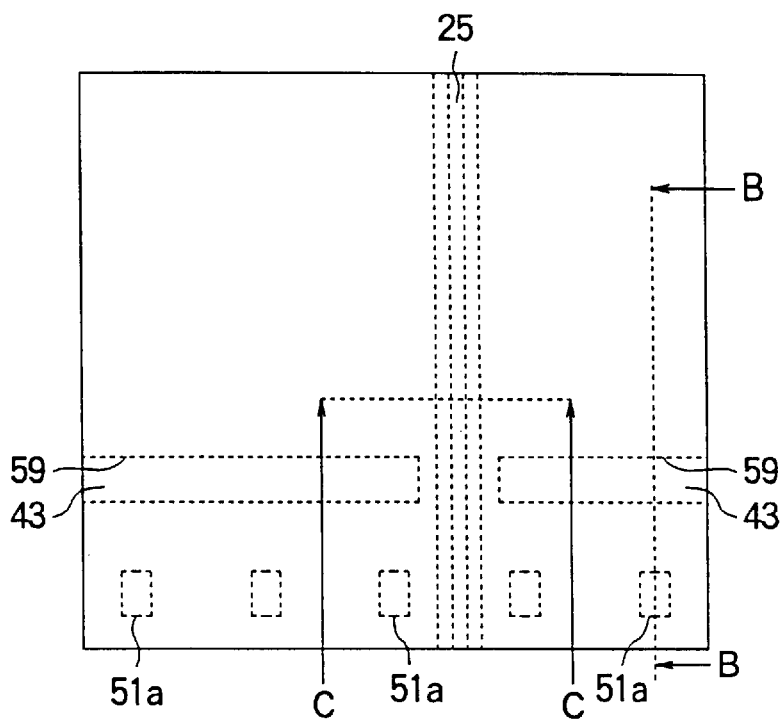
FIG. 29A is a plan view illustrating a further stage in this fabrication process.
Figure 29B:
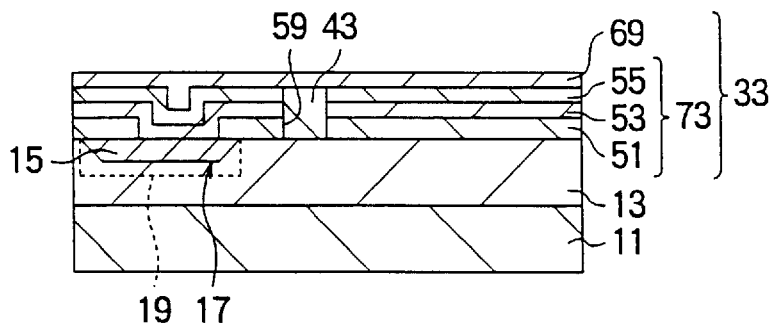
FIGS. 29B and 29C are sectional views through lines B—B and C—C, respectively, in FIG. 29A.
Figure 29C:
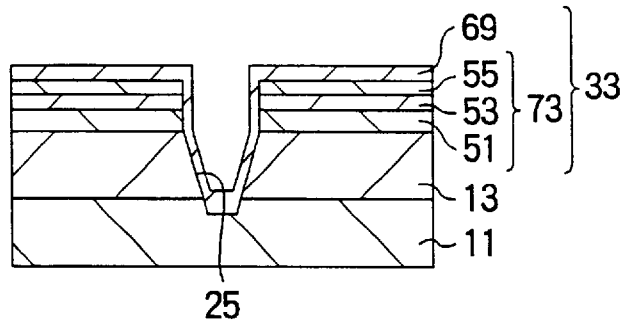

A layer of SiN 1000 Å thick is now deposited on the entire wafer surface by plasma CVD to form the additional insulating layer 69. As shown in FIGS. 29A, 29B, and 29C, this additional insulating layer 69 coats the isolation channels 25 and the sidewalls 71 of the multilayer film 73, as well as the upper surface of the multilayer film 73. The multilayer film 73 and additional insulating layer 69 constitute the first inter-layer insulating film 33.

Referring to FIGS. 30A, 30B, and 30C, the shared lines 29, second inter-layer insulating film 35, via holes 37 and 47, openings 39, block lines 41, block bonding pads 45, individual lines 31, and shared-line bonding pads (not visible) are formed as in the first embodiment.

By coating the isolation channels 25 with a comparatively thin additional insulating layer 69 in place of the thicker multilayer film 73, the fourth embodiment avoids the possible formation of acute angles in the path of the shared lines 29 at the bottom of the isolation channels 25.

Fifth Embodiment

The fifth embodiment combines features of the first and third embodiments by giving the isolation channels a rectangular cross section in the vicinity of the light-emitting diodes 19 and block electrodes 43, and a trapezoidal cross section below the shared lines 29. The description below will focus on the differences between the third and fifth embodiments.

Figure 31A:
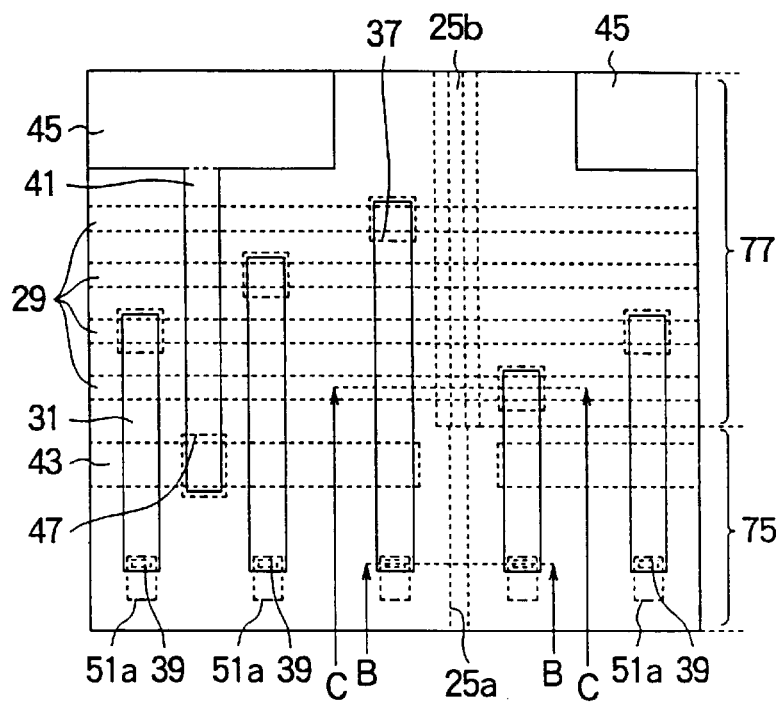
FIG. 31A is a plan view of a fifth embodiment of the invented light-emitting-diode array.
Figure 31B:
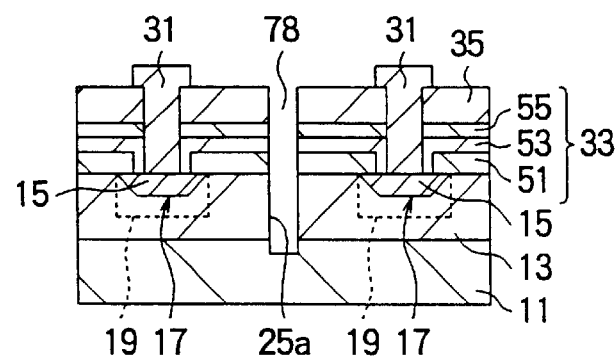
FIGS. 31B and 31C are sectional views through lines B—B and C—C, respectively, in FIG. 31A.

The structure of the fifth embodiment will be described with reference to FIGS. 31A, 31B, and 31C. Referring to FIG. 31A, the plan-view layout of component elements is the same as in the third embodiment, except for the shape of the isolation channels, each of which can now be divided into a rectangular segment 25a and a trapezoidal segment 25b. The rectangular segment 25a includes both the part of the isolation channel that passes through the row of light-emitting diodes 19 and the part that passes between adjacent block electrodes 43. The rest of the isolation channel constitutes the trapezoidal segment 25b. Thus the isolation channels are rectangular in a first area 75 of the light-emitting-diode array, and trapezoidal in a second area 77 of the light-emitting-diode array.

Figure 31C:
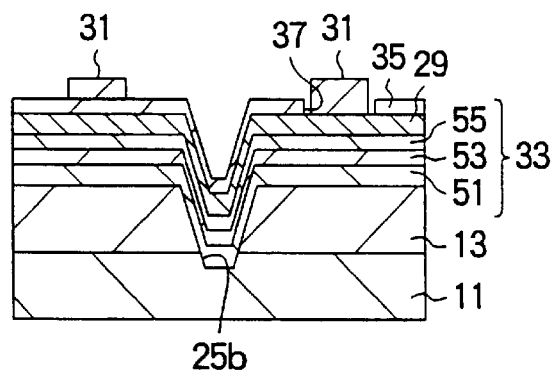

FIG. 31C illustrates the sectional shape of the trapezoidal segment 25b of an isolation channel. This shape is the same as in the third embodiment, except that the width of the trapezoidal segments 25b of the isolation channels is not constrained by the size or spacing of the light-emitting diodes 19. These trapezoidal segments 25b can accordingly be wider than in the third embodiment. If the slope of the sides of the trapezoidal segments 25b is 51°, the bottoms of these trapezoidal segments 25b can have, for example, a width of 10 μm so that the tops of the trapezoidal segments 25b have a width of substantially 20 μm. Besides providing excellent electrical isolation, this wide profile provides more gentle contours for the shared lines 29 to follow. The trapezoidal segments 25b can also be deeper than in the third embodiment.

The trapezoidal segments 25b of the isolation channels are covered by the first inter-layer insulating film 33, which comprises the diffusion mask 51, diffusion-source film 53, and anneal-cap film 55, as in the third embodiment.

FIG. 31C illustrates the sectional shape of the rectangular segment 25a of an isolation channel. This shape is, for example, the same as in the first embodiment, with a width of 5 μm and a depth of 6 μm. The openings 78 above the rectangular segments 25a, however, can extend through the second inter-layer insulating film 35 as well as the first inter-layer insulating film 33, because the shared lines 29 do not cross the rectangular segments 25a.

The rectangular segments 25a of the isolation channels are not filled with an insulating material in this embodiment. If necessary, however, the rectangular segments 25 and openings 78 can be filled with an insulating material such as polyimide, as in the first embodiment, to provide more reliable electrical isolation.

The fabrication process for the fifth embodiment begins with the formation of the trapezoidal segments 25b of the isolation channels, the diffusion areas 15, and all of the other constituent elements except the rectangular segments 25a of the isolation channels, using the same methods as in the fabrication process for the third embodiment. Next, the first and second inter-layer insulating films 33 and 35 are patterned by photolithography and etching to create openings 78 by removing material from the desired locations of the rectangular segments 25a of the isolation channels. A photoresist having windows disposed over these openings 78 is then formed for use as a dry etching mask. The width of the windows in this dry etching mask should not exceed the width of the openings 78, but may be narrower, to allow for lateral etching. The etchant is a mixture of $BCl_3$ and $Cl_2$ gases, and the etching is performed under conditions that impart the desired rectangular shape to the isolation channel segments 25a.

Sixth Embodiment

The sixth embodiment differs from the second embodiment in the size of the groups of light-emitting diodes, the layout of the bonding pads, and the composition of the first inter-layer insulating film 33.

The structure of the sixth embodiment is illustrated in FIGS. 32A, 32B, 32C, and 32D. The semi-insulating GaAs lower layer 11, n-type epitaxial GaAs upper layer 13, p-type diffusion areas 15, isolation channels 25, shared lines 29, individual lines 31, second inter-layer insulating film 35, and block electrodes 43 are substantially the same as in the second embodiment, but there are eight diffusion areas 15 per block 23. Accordingly, there are eight shared lines 29 instead of four. Also, each block electrode 43 occupies less than half the width of a block 23. The eight shared-lines bonding pads 79 coupled to the shared lines 29 are disposed in the remaining width of eight of the blocks 23, so that the block bonding pads 45 and shared-line bonding pads 79 are lined up in a single row, as shown in FIG. 32A.

The first inter-layer insulating film 33 in this embodiment comprises the diffusion mask 51 and an additional insulating layer 69 of SiN, generally similar to the additional insulating layer 69 in the fourth embodiment, but does not include the diffusion-source film 53 and anneal-cap film 55 used in the solid-phase diffusion process. As shown in FIG. 32B, the block electrodes 43 extend through the entire first inter-layer insulating film 33, including both the diffusion mask 51 and the additional insulating layer 69. The second inter-layer insulating film 35 is made of polyimide, as in the second embodiment, and fills the isolation channels 25, as shown in FIG. 32C. The additional insulating layer 69 is not used to coat the isolation channels 25, because the shared lines 29 that cross the isolation channels 25 are disposed above the second inter-layer insulating film 35, as shown in FIG. 32D.

An advantage of the sixth embodiment is that placing the block bonding pads 45 and shared-line bonding pads 79 in a single row simplifies the wire bonding process that interconnects the light-emitting-diode array to its driver IC (not visible).

Next, a fabrication method for the sixth embodiment will be described with reference to FIGS. 33A to 41.

As in the preceding embodiments, the first step is the formation of a diffusion mask 51 with a row of diffusion windows 51a in the desired locations of the light-emitting diodes. FIGS. 33A, 33B, 33C, and 33D illustrate the state at the conclusion of this step. A diffusion-source film 53 and anneal-cap film 55 are then deposited on the diffusion mask 51, and the wafer is annealed to form the diffusion areas 15. FIGS. 34A, 34B, 34C, and 34D show the state at the conclusion of this step.

Next, the diffusion-source film 53 and anneal-cap film 55 are removed by etching. The diffusion mask 51 is then patterned by further photolithography and etching to form groove-like openings 57 in the desired locations of the isolation channels, and slot-like openings 59 in the desired locations of the block electrodes. FIGS. 35A, 35B, 35C, and 35D show the state at the conclusion of this step.

Referring to FIGS. 36A, 36B, 36C, and 36D, the additional insulating layer 69 is now deposited and patterned by photolithography and dry etching to form openings in the same locations as the openings in the diffusion mask 51. The diffusion windows 51a and the above-mentioned openings 57 and 59 are thereby extended through the additional insulating layer 69. In addition, a layer of aluminum is deposited and patterned by photolithography and wet etching, or by the lift-off method, to form the individual lines 31. To ensure good (ohmic) electrical contact between these individual lines 31 and the diffusion areas 15, the aluminum is sintered. To prevent oxidation, the upper surface of the aluminum is plated with nickel.

Next, the block electrodes 43 are formed. As in the preceding embodiments, the block electrodes 43 comprise a gold alloy, which is patterned by the lift-off method. The block electrodes 43 are sintered to form ohmic contacts with the upper layer 13 of the substrate. FIGS. 37A, 37B, and 37C show the state at the conclusion of this step.

Figure 38:
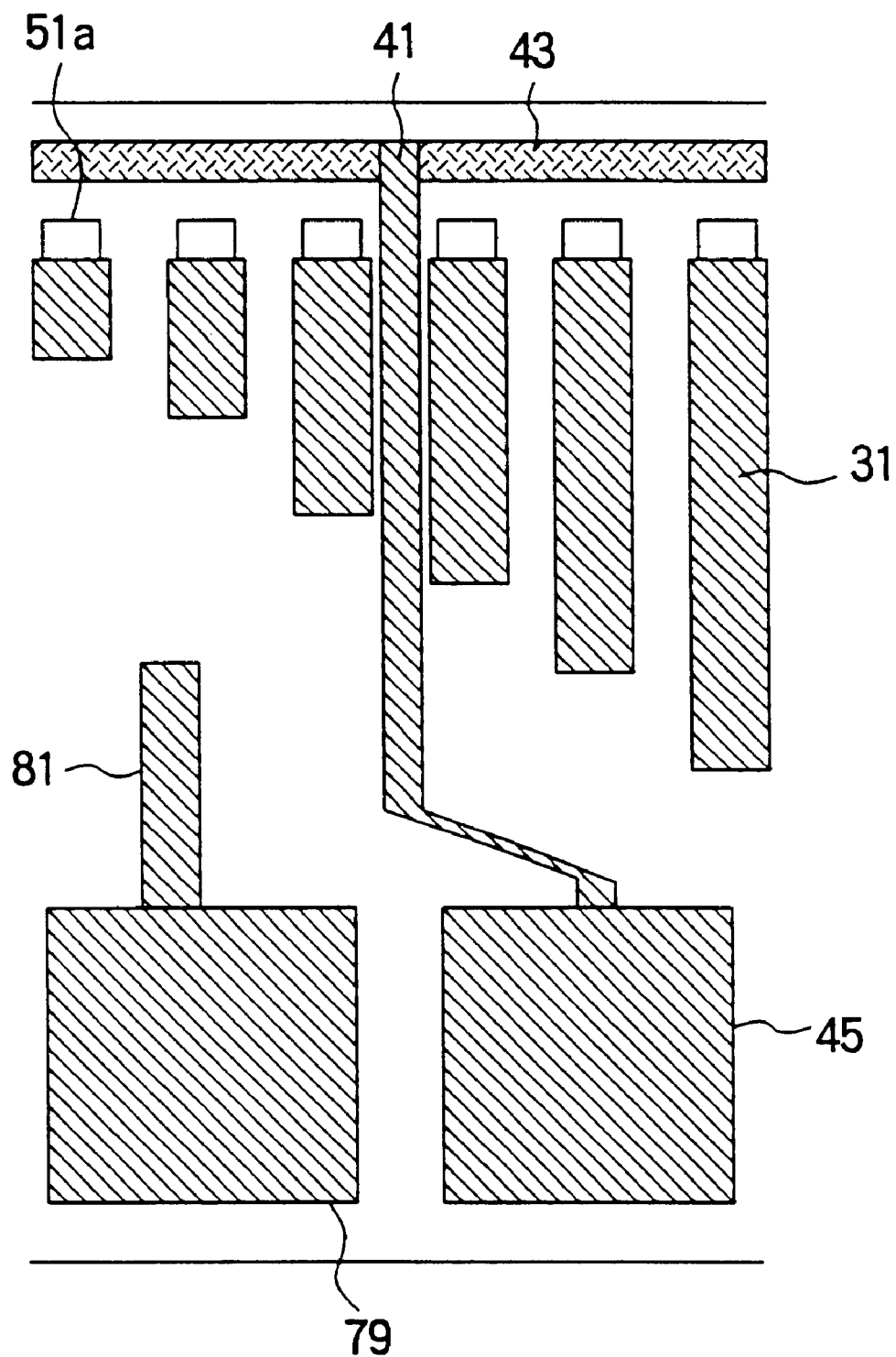
FIG. 38 is a plan view illustrating a further stage in this fabrication process.

Referring to FIG. 38, the block lines 41, the block bonding pads 45, the shared-line bonding pads 79, and the interconnecting lines 81 that will join the shared-line bonding pads 79 to the shared lines are now formed by depositing and patterning a layer of aluminum. This layer of aluminum is also plated with nickel to prevent oxidation.

Figure 39B:
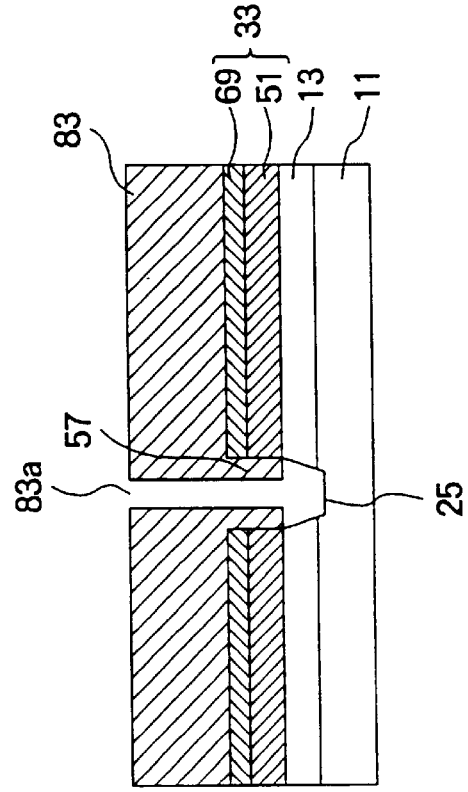
FIG. 39B is a sectional view through line B—B in FIG. 39A.
Figure 39A:
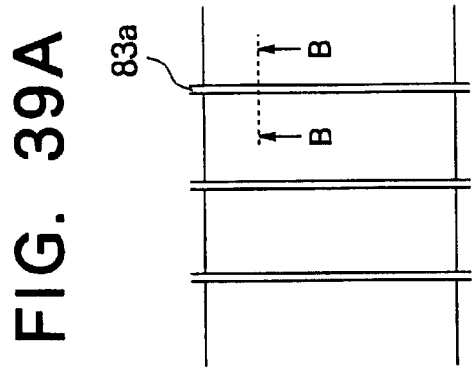
FIG. 39A is a plan view illustrating a further stage in this fabrication process.

Referring to FIGS. 39A and 39B, the wafer is now coated with a negative photoresist 83, which is patterned to form groove-like openings 83a above the openings 57 in the first inter-layer insulating film 33, and the isolation channels 25 are formed by etching with an aqueous solution of phosphoric acid and hydrogen peroxide, using the negative photoresist 83 as an etching mask. The openings 83a in the negative photoresist 83 are preferably narrower than the openings 57 in the first inter-layer insulating film 33. The dimensions of these openings 83a and the etching conditions should be chosen so that the etching stops when the width of the isolation channels 25 is substantially equal to the width of the openings 57 in the first inter-layer insulating film 33. In this way it is possible to avoid leaving an overhang of the first inter-layer insulating film 33 without etching the first inter-layer insulating film 33.

Figure 40:
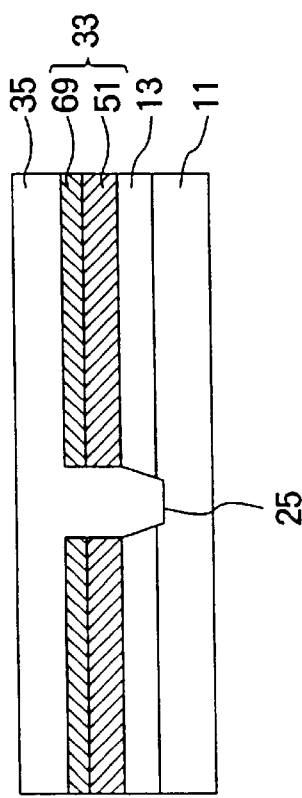
FIG. 40 is a sectional view illustrating a further stage in this fabrication process.

The negative photoresist 83 is now removed and the entire wafer is coated with polyimide to form the second inter-layer insulating film 35, as illustrated in FIG. 40. The second inter-layer insulating film 35 also fills the isolation channels 25.

Figure 41:
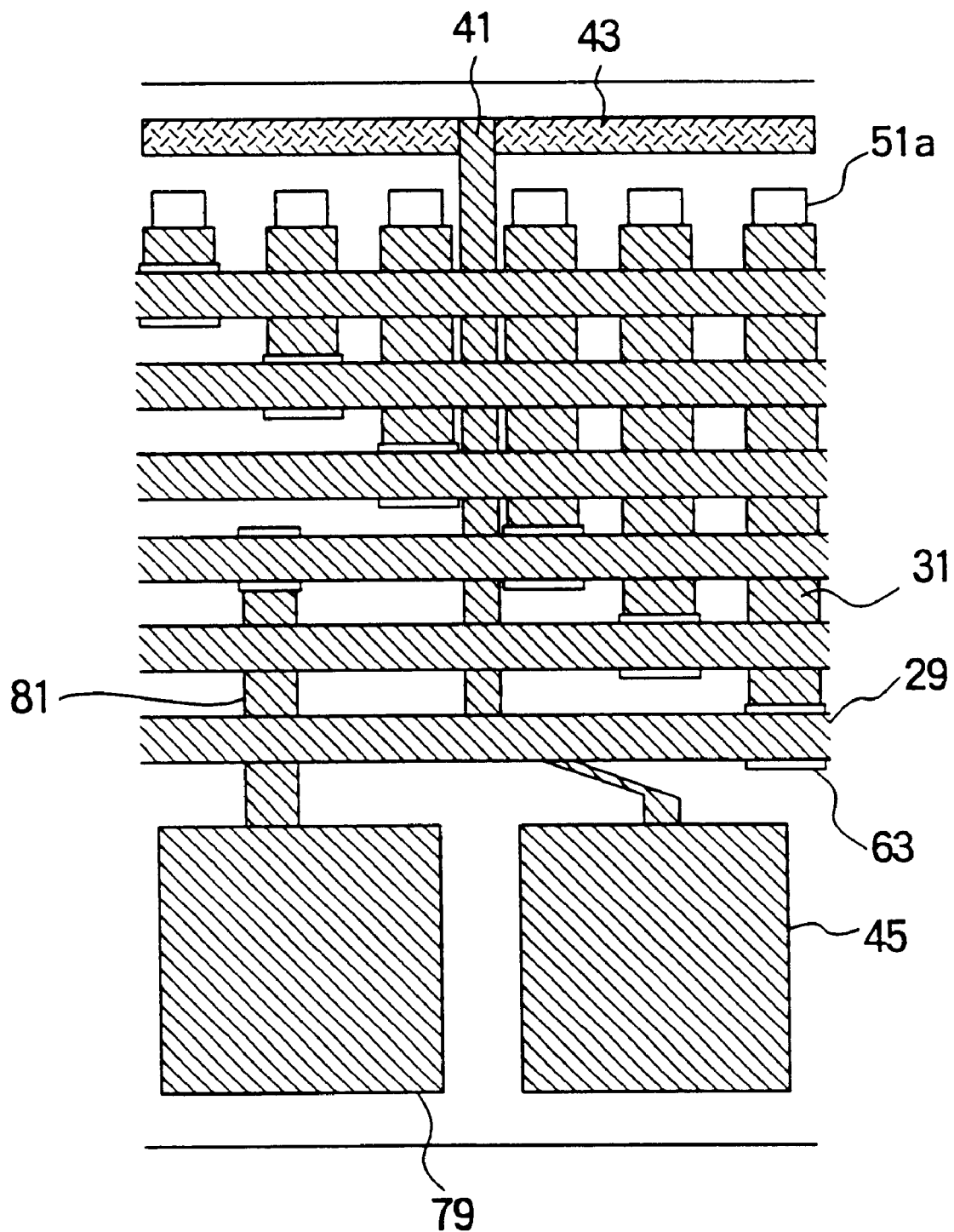
FIG. 41 is a plan view illustrating a further stage in this fabrication process.

Finally, referring to FIG. 41, via holes 63 are opened in the second inter-layer insulating film 35, and another layer of aluminum is deposited and patterned to form the shared lines 29, which make electrical contact with the individual lines 31 and interconnecting lines 81 through these via holes 63. Windows are also opened in the second inter-layer insulating film 35 to expose the block bonding pads 45 and shared-line bonding pads 79.

An advantage of the fabrication process described in the sixth embodiment is that the sintering of both the individual lines 31 and block electrodes 43 is completed before the formation of the block lines 41. Electrical contact between the aluminum block lines 41 and gold-alloy block electrodes 43 is therefore unaffected by any sintering processes.

Figure 42:
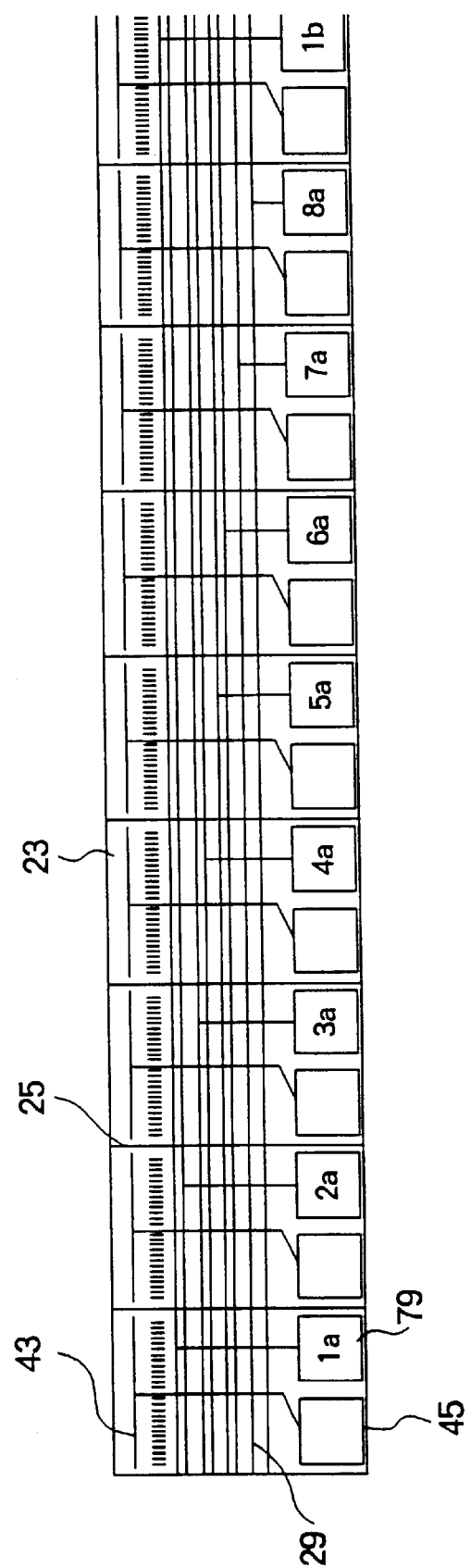
FIG. 42 is a plan view illustrating a variation of the sixth embodiment.

FIG. 42 illustrates a variation of the sixth embodiment in which multiple bonding pads 79 are provided for each shared line 29. At the maximum, one shared-line bonding pad 79 can be placed in every block 23. In FIG. 42, the first eight shared-line bonding pads 79 (numbered 1a, 2a, . . . , 8a in FIG. 42) are coupled to the eight shared lines 29 in turn; then the same sequence begins again (1b, . . . ).

One advantage of this scheme is that there is less voltage drop due to the resistance of the shared lines 29, because each shared line 29 is supplied with the same voltage at multiple points. As a result, a more uniform optical output is obtained from the light-emitting diodes than when there is only one bonding pad 79 per shared line 29.

Another advantage is that, because the resistance of the shared lines 29 is not such a problem, the shared lines 29 can be made thinner, and the width of the light-emitting-diode array can be reduced. In an electrophotographic printer, the space saved in this way can be significant. Furthermore, the length of the shared lines 29 can be increased; hence, the length of the array and the number of light-emitting diodes can be increased. The number of separate light-emitting-diode array chips needed in an electrophotographic printing head can therefore be reduced, reducing the assembly cost of the printing head.

It is not necessary to place a shared-line bonding pad 79 in every block 23. The number of shared-line bonding pads per shared line 29 can be determined according to factors such as the electrical resistance of the shared lines 29 and the design margin of the light-emitting-diode array.

Figure 43:
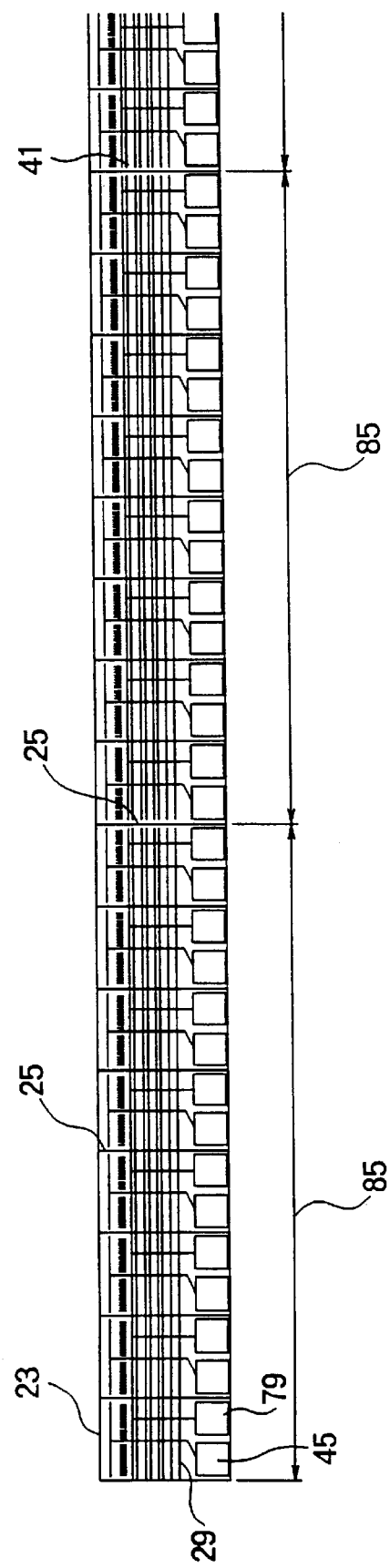
FIG. 43 is a plan view illustrating another variation of the sixth embodiment.

FIG. 43 illustrates another variation, in which the array is divided into sections 85, each comprising a plurality of blocks 23. The boundaries between sections 85 coincide with certain isolation channels 25. Within each section 85, the shared lines 29 cross the isolation channels 25; at the section boundaries, the shared lines 29 do not cross the isolation channels 25. At least one shared-line bonding pad 79 is provided for each shared line 29 in each section 85. The shared lines 29, which extended the entire length of the array in the preceding embodiments, are thereby divided into sections.

This arrangement enables each section of each shared line 29 to be driven at a different time, to reduce maximum current consumption. In other words, each section of each shared line 29 functions as a separate shared line that extends for only one part of the length of the array. The number of blocks 23 per section 85 becomes a design parameter that can be selected according to electrical characteristics and requirements.

The variations shown in FIGS. 42 and 43 can also be applied to any of the preceding embodiments.

Figure 44:
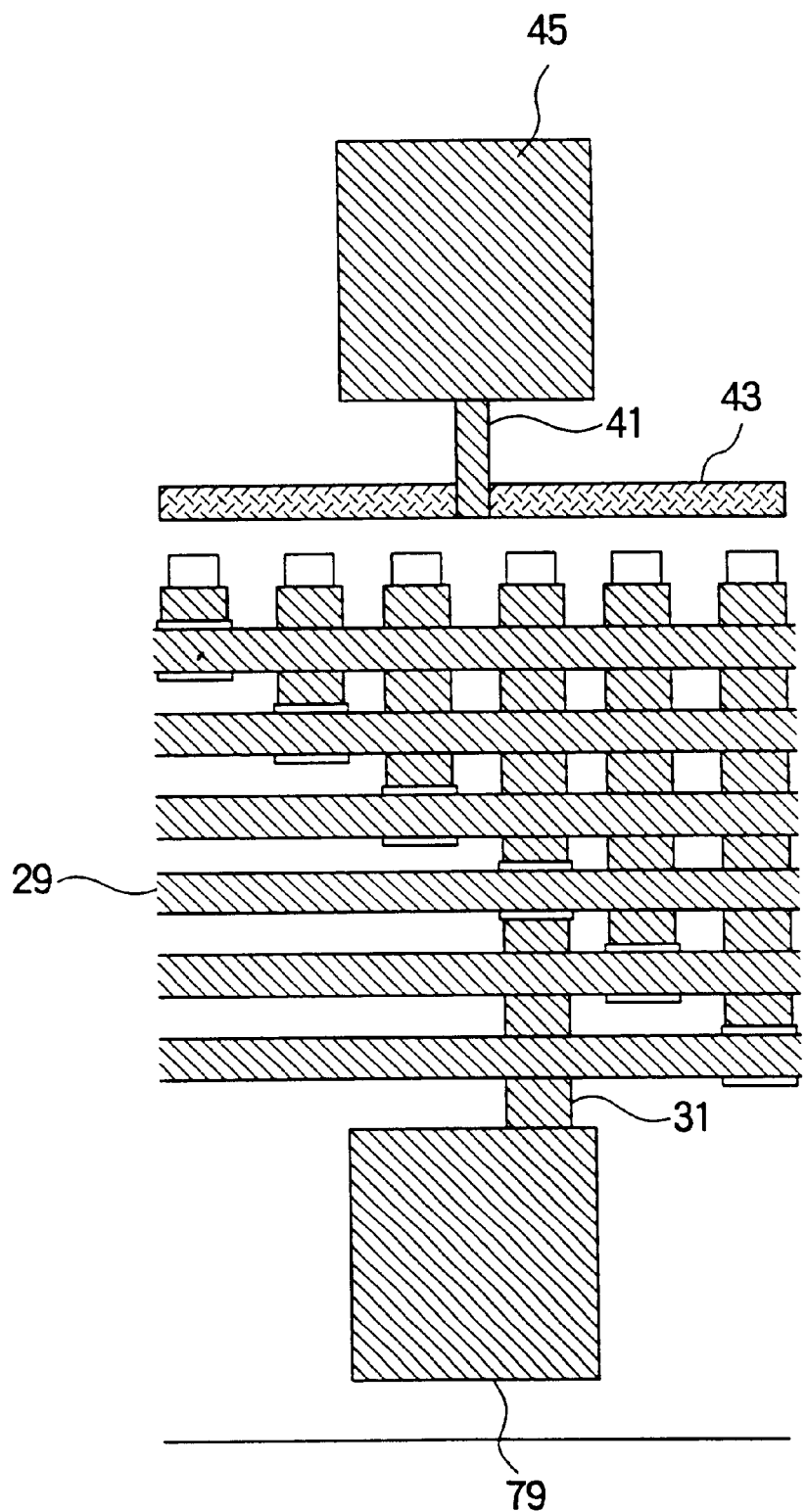
FIG. 44 is a plan view illustrating another variation of the sixth embodiment.

FIG. 44 illustrates yet another variation of the sixth embodiment, in which the block bonding pads 45 and shared-line bonding pads 79 are placed on opposite sides of the array of light-emitting diodes, as in the second embodiment. This arrangement can be used to gain additional space for the bonding pads. A further advantage is that each block bonding pad 45 can be placed in the center of its block, and can therefore be coupled to the center of the block electrode 43 by a short, straight block line 41. The patterning of the block lines 41 is therefore simplified, and their electrical resistance can be reduced. FIG. 44 should be compared with FIGS. 32A to 43, in which the block lines are longer and are not straight.

FIG. 44 also shows that a shared line 29 and a shared-line bonding pad 79 can be interconnected by an extension of an individual line 31, instead of by a separate interconnecting line.

Figure 45:
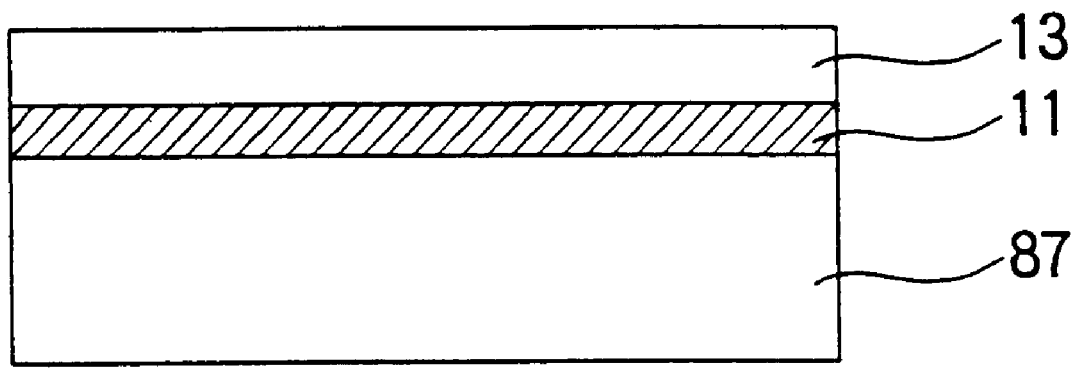
FIG. 45 is a sectional view illustrating a variation of the substrate employed in the invention.

FIG. 45 illustrates a variation of the substrate on which the invented light-emitting-diode array is formed. This substrate comprises a high-resistance base layer 87 such as a silicon layer. The semi-insulating lower layer 11 acts as a buffer layer between the base layer 87 and the semiconducting upper layer 13.

The invention is not limited to the embodiments and variations described above. For example, the diffusion areas can be formed by solid-state diffusion of an impurity from a diffusion-source film that has been patterned into islands located over the intended diffusion areas. If the array density is comparatively low, the diffusion areas can be formed by vapor-phase diffusion.

The semiconducting upper layer 13 is not limited to GaAs; an $Al_xGa_{1-x}As$ layer can be used, for example, where x is a composition parameter that can be determined according to the desired wavelength of emitted light. The annealing time can be altered accordingly, e.g. to one hour at 650° C., still producing diffusion areas with a junction depth of between 1 $\mu$m and 1.5 $\mu$m.

The block electrodes 43 do not have to be formed from a gold alloy; other materials can be used.

The diffusion mask 51 does not have to be used as part of the first inter-layer insulating film 33. The diffusion mask can be removed after the diffusion has been completed, and a new insulating film can be deposited and patterned.

The isolation channels 25 can be planarized by being filled with an insulating material regardless of their shape, provided the shape admits such filling. The trapezoidal isolation channels in the third, fourth, and fifth embodiments can be filled with an insulating material, for example.

When the isolation channels 25 are given a trapezoidal shape, this can be done by dry etching instead of wet etching. The slope of the sides of the isolation channels is not limited to the value (51°) mentioned in the embodiments.

The shapes of the diffusion areas 15 and bonding pads are not limited to the rectangular shapes shown in the embodiments.

The invention can also be practiced with light-emitting diodes comprising n-type diffusion areas 15 formed in a p-type upper layer 13.

Those skilled in the art will recognize that further modifications are possible within the scope claimed below.

What is claimed is:

1. A light-emitting-diode array, comprising:
   a semiconductor chip having an upper main surface with a width direction and a length direction;
   a row of light-emitting elements formed in said upper main surface of the semiconductor chip, the row extending in the length direction and dividing said upper main surface, in the width direction, into a first region disposed on one side of the row and a second region disposed on another side of the row;
   a plurality of shared-line bonding pads disposed in the first region, each shared-line bonding pad corresponding to a plurality of light-emitting elements in the row;
   a wiring matrix formed on said upper main surface of the semiconductor chip, connecting the shared-line bonding pads to the corresponding light-emitting elements;
   a plurality of block bonding pads disposed in the first region;
   a plurality of block electrodes formed on said upper main surface of the semiconductor chip, each block electrode being electrically coupled through the semiconductor chip to a consecutive group of the light-emitting diodes in the row; and
   a plurality of block lines connecting said block bonding pads to respective block electrodes.

2. The light-emitting diode array of claim 1, wherein the block electrodes are disposed in the second region.

3. The light-emitting diode array of claim 1, wherein the block electrodes are disposed in the first region.

* * * * *

UNITED STATES PATENT AND TRADEMARK OFFICE
CERTIFICATE OF CORRECTION

PATENT NO. : 6,563,138 B2  Page 1 of 1
DATED : May 13, 2003
INVENTOR(S) : Mitsuhiko Ogihara et al.

It is certified that error appears in the above-identified patent and that said Letters Patent is hereby corrected as shown below:

<u>Title page,</u>
Item [73], Assignee, please change "Oki Electric Industry Co. Ltd., Tokyo (JP)" to
-- Oki Data Corporation, Tokyo, JAPAN --

Signed and Sealed this

Second Day of December, 2003

JAMES E. ROGAN
*Director of the United States Patent and Trademark Office*